(12) United States Patent
Manap et al.

(10) Patent No.: US 11,721,654 B2
(45) Date of Patent: *Aug. 8, 2023

(54) ULTRA-THIN MULTICHIP POWER DEVICES

(71) Applicant: SEMICONDUCTOR COMPONENTS INDUSTRIES, LLC, Phoenix, AZ (US)

(72) Inventors: Nurul Nadiah Manap, Seremban (MY); Shutesh Krishnan, Seremban (MY); Soon Wei Wang, Seremban (MY)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 83 days.

This patent is subject to a terminal disclaimer.

(21) Appl. No.: 17/249,154

(22) Filed: Feb. 22, 2021

(65) Prior Publication Data

US 2021/0183799 A1    Jun. 17, 2021

Related U.S. Application Data

(62) Division of application No. 15/939,843, filed on Mar. 29, 2018, now Pat. No. 10,930,604.

(51) Int. Cl.
*H01L 25/065* (2023.01)
*H01L 23/00* (2006.01)

(52) U.S. Cl.
CPC ............. *H01L 24/06* (2013.01); *H01L 24/97* (2013.01); *H01L 25/0655* (2013.01);
(Continued)

(58) Field of Classification Search
CPC . H01L 25/0655; H01L 24/97; H01L 2924/14; H01L 24/06; H01L 25/50;
(Continued)

(56) References Cited

U.S. PATENT DOCUMENTS

| 4,312,023 A | 1/1982 | Frappart et al. |
| 7,678,609 B2 | 3/2010 | Pavier |

(Continued)

FOREIGN PATENT DOCUMENTS

CN    102308349 A    1/2012

OTHER PUBLICATIONS

Lim, Michele Hui Fern, "Low Temperature Co-fired Ceramics Technology for Power Magnetics Integration", Nov. 17, 2008, 226 pages.

(Continued)

*Primary Examiner* — Thanh Y. Tran
(74) *Attorney, Agent, or Firm* — Brake Hughes Bellermann LLP

(57) ABSTRACT

A method includes attaching semiconductor die to a carrier between copper pillars, covering with molding, backside grinding to expose first ends of the pillars and backside drain contacts of the die, and applying a layer of conductive material to electrically connect the first ends of the pillars and the backside drain contacts. The method further includes cutting grooves in the conductive material to isolate adjacent die, removing the carrier to expose second ends of the copper pillars in place in the molding, applying another layer of conductive material to electrically connect the second ends of the copper pillars and source contacts of adjacent die, singulating individual MCM packages each including a first die and a second die with a source of the first die connected to a drain of the second die via one of the copper pillars left in place in the molding.

18 Claims, 17 Drawing Sheets

(52) U.S. Cl.
CPC ............... *H01L 2224/16245* (2013.01); *H01L 2924/01029* (2013.01); *H01L 2924/14* (2013.01)

(58) Field of Classification Search
CPC ....... H01L 25/072; H01L 24/92; H01L 24/82; H01L 2924/181; H01L 21/76885; H01L 45/1233; H01L 2224/16245; H01L 2924/01029
See application file for complete search history.

(56) References Cited

U.S. PATENT DOCUMENTS

| | | | |
|---|---|---|---|
| 7,737,871 B2 | 6/2010 | Leung et al. | |
| 7,838,964 B2 | 11/2010 | Carobolante et al. | |
| 7,902,627 B2 | 3/2011 | Dong et al. | |
| 8,088,645 B2 | 1/2012 | Liu et al. | |
| 8,110,474 B2 | 2/2012 | Carobolante et al. | |
| 8,169,108 B2 | 5/2012 | Dupuis et al. | |
| 8,188,814 B2 | 5/2012 | Ng et al. | |
| 8,344,464 B2 | 1/2013 | Cho | |
| 8,421,204 B2 | 4/2013 | Liu et al. | |
| 8,497,573 B2 | 7/2013 | Cho et al. | |
| 8,525,334 B2 | 9/2013 | Cardwell | |
| 8,614,503 B2 | 12/2013 | Cho | |
| 8,637,341 B2 * | 1/2014 | Otremba | H01L 24/97 438/112 |
| 9,177,925 B2 | 11/2015 | Ashrafzadeh et al. | |
| 9,478,519 B2 | 10/2016 | Ashrafzadeh et al. | |
| 9,679,878 B1 * | 6/2017 | Lin | H01L 21/76802 |
| 10,872,865 B2 * | 12/2020 | Yu | H01L 23/5384 |
| 10,930,604 B2 * | 2/2021 | Manap | H01L 24/24 |
| 2006/0109605 A1 | 5/2006 | Matters-Kammerer | |
| 2006/0267159 A1 | 11/2006 | Yamamoto et al. | |
| 2007/0040238 A1 | 2/2007 | Yamasaki et al. | |
| 2007/0062027 A1 | 3/2007 | Ripamonti et al. | |
| 2007/0080587 A1 | 4/2007 | Ruizenaar et al. | |
| 2009/0073633 A1 | 3/2009 | Tews et al. | |
| 2010/0109123 A1 | 5/2010 | Strzalkowski et al. | |
| 2011/0013349 A1 | 1/2011 | Morikita | |
| 2011/0018136 A1 | 1/2011 | Bedair et al. | |
| 2011/0062584 A1 | 3/2011 | Ishihara | |
| 2011/0068427 A1 | 3/2011 | Paek et al. | |
| 2011/0156243 A1 | 6/2011 | Chang et al. | |
| 2011/0156261 A1 | 6/2011 | Kapusta et al. | |
| 2011/0285215 A1 | 11/2011 | Hatase | |
| 2012/0175732 A1 | 7/2012 | Lin et al. | |
| 2013/0037909 A1 | 2/2013 | French et al. | |
| 2013/0082364 A1 | 4/2013 | Wang et al. | |
| 2013/0154071 A1 | 6/2013 | Haigh et al. | |
| 2013/0241077 A1 * | 9/2013 | Fuergut | H01L 23/5389 257/774 |
| 2014/0071650 A1 | 3/2014 | Flores et al. | |
| 2014/0312458 A1 | 10/2014 | Ashrafzadeh et al. | |
| 2015/0200162 A1 | 7/2015 | Constantino et al. | |
| 2016/0126219 A1 | 5/2016 | Ashrafzadeh et al. | |
| 2017/0345761 A1 | 11/2017 | Yu et al. | |
| 2017/0373038 A1 | 12/2017 | Lin et al. | |
| 2018/0033777 A1 | 2/2018 | Lin et al. | |
| 2018/0204866 A1 | 7/2018 | Hsieh | |
| 2018/0211939 A1 | 7/2018 | Lin et al. | |
| 2019/0139898 A1 * | 5/2019 | Chang | H01L 21/561 |
| 2019/0164783 A1 * | 5/2019 | Huang | H01L 24/20 |

OTHER PUBLICATIONS

U.S. Appl. No. 15/939,843, filed Mar. 29, 2018, Allowed.

* cited by examiner

ULTRA-THIN MULTICHIP POWER DEVICES

RELATED APPLICATION

This application is a divisional of U.S. patent application Ser. No. 15/939,843, filed on Mar. 29, 2018, entitled "Ultra-Thin Multichip Power Devices," which is incorporated by reference herein in its entirety.

TECHNICAL FIELD

The present disclosure relates to relates to semiconductor devices and device packaging, in particular, to packaging of multi-chip power devices.

BACKGROUND

Modern electronic devices (e.g., transistors) and circuits (e.g., integrated circuits (ICs)) can be fabricated in semiconductor die. Semiconductor die can be encapsulated in a supporting material that prevents physical damage and corrosion during a packaging process. During packaging, a multi-chip module (MCM) package can be configured to include multiple semiconductor die that are integrated so that, in use, the MCM package is treated as if it were a single component. Several devices may be integrated in an MCM package that can be used to, for example, provide power circuitry on a computer motherboard as a single component in a package of reduced size (compared to the use of multiple packages of individual ICs). An MCM package can include multiple flags for bonding of the semiconductor die onto a unifying substrate and can include wire and/or clips for interconnection between the semiconductor die. The flags for bonding and the wire and/or clips for interconnection add, in an undesirable fashion, to the height (or thickness) of the MCM package form or profile.

SUMMARY

A multi-chip module (MCM) package includes a molded body portion having a first outer surface and a second outer surface, a conductive layer defining at least a portion of the first outer surface of the molded body portion of the MCM package, and a conductive connection layer portion disposed outside the second outer surface of the molded body portion of the MCM package. A first semiconductor die is disposed between the conductive layer and the conductive connection layer, and a second semiconductor die is disposed between the conductive layer and the conductive connection layer. A first molding portion is disposed between the first semiconductor die and the second semiconductor die. The first molding portion extends between the first outer surface and the second outer surface of the molded portion of the MCM package. Further, in the MCM package, a conductive pillar is electrically coupled to the conductive layer defining at least a portion of the first outer surface and the conductive connection layer portion disposed outside of the second outer surface.

Another multi-chip module (MCM) package includes a molded body portion having a first outer surface and a second outer surface, a first conductive layer portion and a second conductive layer portion collectively defining at least a portion of the first outer surface of the molded body portion, and a conductive pillar electrically coupled to the second conductive layer portion. The MCM package further includes a conductive connection layer portion having a first portion disposed outside of the second outer surface the molded body portion of the MCM package and a second portion recessed into the molded body portion of the MCM package and electrically coupled to the conductive pillar. The MCM package also includes a first semiconductor die disposed between the conductive layer and the conductive connection layer portion, a second semiconductor die, and a first molding portion disposed between the first semiconductor die and the second semiconductor die. The first molding portion extends between the first outer surface and the second outer surface of the molded body portion of the MCM package.

A method includes attaching semiconductor die to a temporary carrier substrate between copper pillars disposed on the temporary carrier substrate. Each of the semiconductor die has a backside metal drain contact. The method includes covering the attached die and the copper pillars on the temporary carrier substrate with molding material, backside grinding the molding material to expose first ends of the copper pillars and the backside metal drain contacts of the semiconductor die, and applying a first layer of conductive material to electrically connect the first ends of the copper pillars and backside metal drain contacts of the semiconductor die. The method further includes cutting grooves in the first layer of conductive material to isolate adjacent semiconductor die to be contained in individual multi-chip module (MCM) packages, removing the temporary carrier substrate to expose second ends of the copper pillars in place in the molding material, and applying a second layer of conductive material to electrically connect the second ends of the copper pillars and source contacts of adjacent semiconductor die. The method further involves singulating the individual MCM packages. Each individual MCM package includes a first semiconductor die and a second semiconductor die with a source of the first semiconductor die connected to a drain of the second semiconductor die via one of the copper pillars left in place in the molding.

BRIEF DESCRIPTION OF THE DRAWINGS

Like reference characters or numerals represent like elements throughout the various drawings.

DETAILED DESCRIPTION

Multi-chip module (MCM) packages that have a low profile or form including die-die electrical interconnections are described herein. Semiconductor die can be included in protective MCM packages, such as those described herein, to allow for easy handling and assembly onto printed circuit boards and to protect the devices from damage. The semiconductor die can include single devices (e.g., metal-oxide-semiconductor field-effect transistors (MOSFET) devices), one or more integrated circuits, passive components, and/or so forth. In some implementations, the MCM packages described herein can include a pair of MOSFET devices (e.g., a low-side MOSFET device and a high-side MOSFET device) integrated in a single package power MOSFET switch for use, for example, in automotive applications. In some implementations, the use of a pillar and an interconnect (e.g., a re-distribution layer (RDL)) including a wafer back coating (WBC) and/or solder material enable formation of an MCM package as an ultra-thin package solution.

Figure 1:
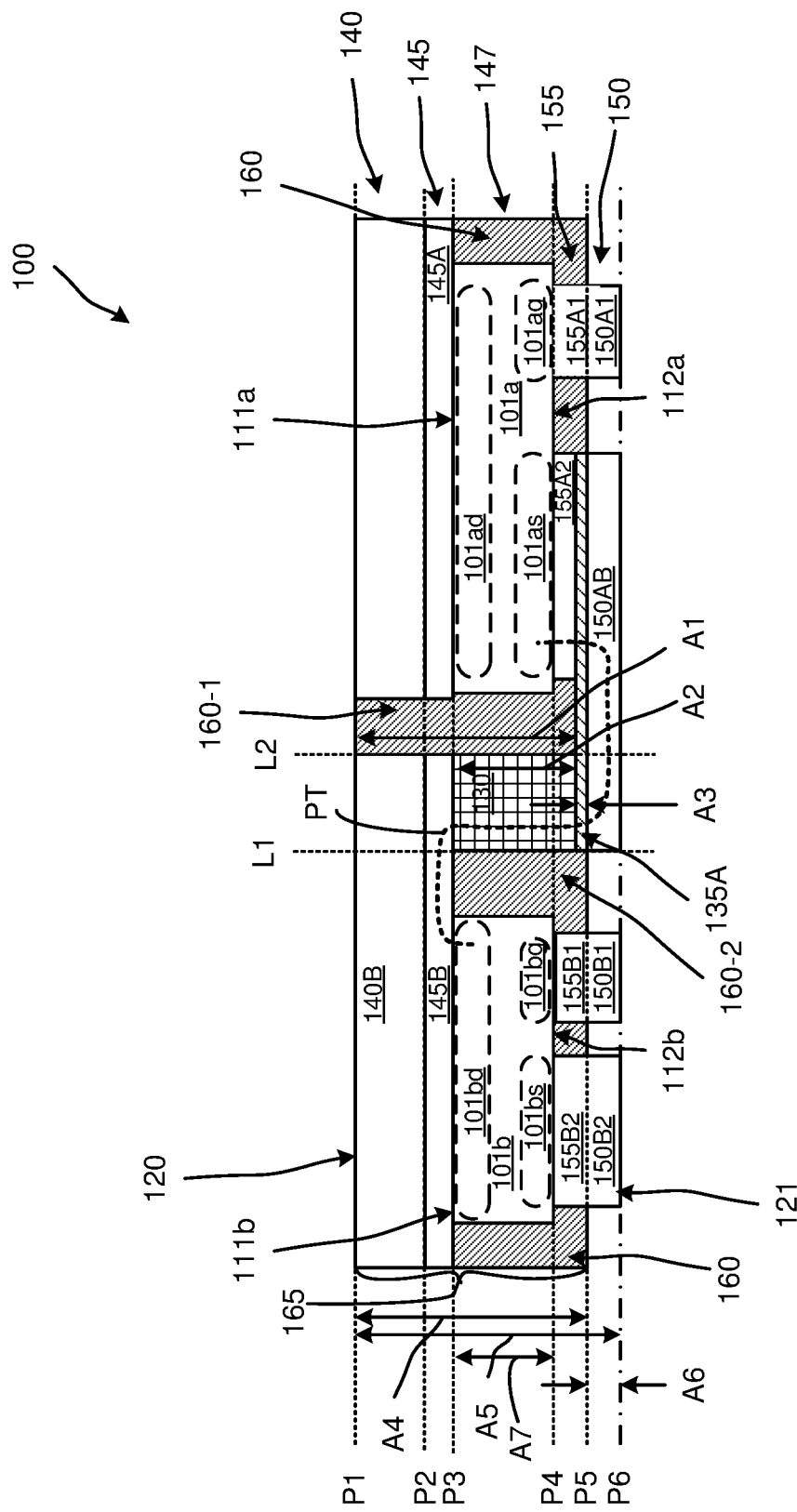
FIG. 1 is a schematic illustration, in cross-sectional view, of an example multi-chip module (MCM) package including at least a pair of semiconductor die.

FIG. 1 shows, in cross-sectional view, an example multi-chip module (MCM) package 100 including a pair of semiconductor die (e.g., die 101a and 101b). As shown in FIG. 1, the semiconductor die 101a has a side 111a and an opposing side 112a. A drain 101ad of semiconductor die 101a is aligned along side 111a (e.g., touching or facing side 111a), while a source 101as and a gate 101ag of semiconductor die 101a is aligned along side 112a (e.g., touching or facing side 112a). Similarly, semiconductor die 101b has a side 111b and an opposing side 112b. A drain 101bd of semiconductor die 101b is aligned along side 111b (e.g., touching or facing side 111b), while a source 101bs and a gate 101bg of semiconductor die 101b is aligned along side 112b (e.g., touching or facing side 112b).

The geometrical disposition of various components of MCM package 100 may be described herein with reference to, for example, spaced apart horizontal planes P1, P2, P3, P4, P5 and P6 extending through MCM package 100, as shown in FIG. 1. The horizontal planes (e.g., P1, P2, P3, P4, etc.), which are depicted by dashed lines in FIG. 1, may be viewed as being orthogonal to the page of FIG. 1 (i.e., orthogonal to the plane of the cross-sectional view shown in FIG. 1). In FIG. 1, inter-plane spacing distances between the various planes are marked by labels A1, A2, A3, A4, . . . , A6, etc. For example, a distance A4 is between plane P1 and P3, a distance A5 is between planes P1 and P6, a distance A6 is between plane P3 and P4, etc.

In the MCM package 100 shown in FIG. 1, semiconductor die 101a and 101b are encapsulated within (e.g., attached or held together by) molding 160 (e.g., a molding material). The molding 160 includes molding portions 160-1, molding portion 160-2, molding portion 160-3, and so forth. The molding 160 is described in more detail below.

Further the geometrical disposition of various components of MCM package 100 may also be described herein with reference to, for example, spaced apart vertical planes (e.g., L1 and L2) extending through MCM package 100. The vertical planes (e.g., L1 and L2, etc.), which like horizontal planes (e.g., P1, P2, P3, P4, etc.) are depicted by dashed lines in FIG. 1, may be viewed as being orthogonal to the page of FIG. 1 and orthogonal to the horizontal planes (e.g., P1, P2, P3, P4, etc.).

The MCM package 100 has a top surface (e.g., a first outer surface 120) that is aligned along plane P1 and a bottom surface (e.g., a second outer surface 121) that may be aligned along plane P6. First outer surface 120 (plane P1) and second outer surface 120 (plane P6) may have an inter-planar spacing distance A5. In accordance with the principles of the present disclosure, the MCM packages described herein have a low profile or form with the inter-planar spacing distance A5 between first outer surface 120 (plane P1) and the second outer surface 120 (plane P6) being less than, for example, 1.0 mm. In some implementations, the overall thickness A5 of the MCM package 100 between planes P1 and P6 can be ultra-thin (e.g., a thickness of less than 0.75 mm).

As shown in FIG. 1, a conductive layer 140 is disposed between planes P1 and P2 and defines at least a portion of the first outer surface 120 of the MCM package 100. The semiconductor die 101a, 101b are coupled to the conductive layer 140 via a first conductive coupling layer 145 (between planes P1 and P2). The semiconductor die 101a, 101b are disposed in die layer 147 between planes P3 and P4. A second conductive coupling layer 155 (between plane P4 and plane P5) couples the semiconductor die 101a, 101b to a conductive connection layer 150 (between planes P5 and P6). The conductive connection layer 150 can be referred to as a re-distribution layer. Sides 111a and 111b of semiconductor die 101a and 101b, respectively, may be aligned with plane P3, while sides 112a and 112b of semiconductor die 101a and 101b, respectively, may be aligned with plane P4.

The MCM package 100 includes a molded body portion 165 between planes P1 and P5. The molded body portion 165 is disposed between planes P1 and P5. Specifically, the molded body portion 165 is defined by the first outer surface 120 along plane P2 included surfaces of the first conductive layer 140 and portions of the molding 160 (e.g., molding 160-1). The molded body portion 165 is defined by a side (or surface) along plane P5 defined at least in part by the second conductive coupling layer 155 and portions of the molding 160. The conductive connection layer 150 is disposed outside of the molded body portion 165.

The conductive connection layer 150 includes a gate contact pad 150A1 of semiconductor die 101a. The conductive connection layer 150 includes a source contact pad 150B2 and a gate contact pad 150B1 of semiconductor die 101b. As noted above, the conductive connection layer 150 defines at least a portion of the second outer surface 121 of the MCM package 100. In this implementation, both of the semiconductor die 101a, 101b are oriented with drain sides toward first conductive layer 140 and gates and sources toward the conductive connection layer 150 disposed outside of the molded body portion 165.

The conductive connection layer 150 is referred to as a connection layer because it includes a die interconnect 150AB between the semiconductor die 101a, 101b. The die interconnect 150AB functions as an interconnect between the semiconductor die 101a, 101b. The die interconnect 150AB also functions as a source contact pad for semiconductor die 101a.

In some instances, the second conductive coupling layer 155 includes a source coupling portion 155A2 and a gate coupling portion 155A1 in electrical contact with source 101as and gate 101ag in semiconductor die 101a. Similarly, in some instances, the second conductive coupling layer 155 includes a source coupling portion 155B2 and a gate coupling portion 155B1 in electrical contact with source 101bs and gate 101bs in semiconductor die 101b. Source coupling portion 155A2, gate coupling portion 155A1, source coupling portion 155B2 and gate coupling portion 155B1 may be made of electrically conductive materials (e.g., metals, metallic alloys, solder, conductive paste or epoxies). The source coupling portion 155A2, gate coupling portion 155A1, source coupling portion 155B2 and gate coupling portion 155B1 are coupled to outer conductive pads (i.e., die interconnect 150AB, gate contact pad 150A1, source contact pad 150B2 and gate contact pad 150B1, respectively) that are also made of electrically conductive materials (e.g., metals, metallic alloys, solder, conductive paste or epoxies, etc.).

As shown in FIG. 1, the MCM package 100 includes a drain coupling portion 145A, an outer conductive plate 140A, a drain coupling portion 145B, and an outer conductive plate 140B. The drain coupling portion 145A and drain coupling portion 145B, which are included in the conductive coupling layer 145 between plane P2 and plane P3, may be made of electrically conductive materials (e.g., conductive paste or epoxies). Outer conductive plate 140A and outer conductive plate 140B, conductive layer 140 between plane P1 (i.e., first outer surface 120) and plane P2, may be made of metal or metallic alloy plates. Drain coupling portion 145A may be in electrical contact with drain 101ad of semiconductor die 101a and may electrically couple drain 101ad to outer conductive plate 140A (e.g., a backside metal drain contact). Similarly, drain coupling portion 145B may be in electrical contact with drain 101bd of semiconductor die 101b and may electrically couple drain 101bd to outer conductive plate 140B (e.g., a backside metal drain contact).

The MCM package 100 includes a die-die interconnection structure that is included at least in part within the molded body portion 165 of MCM package 100. The die-die interconnection structure electrically connects source 101as of semiconductor die 101a with drain 101bd of semiconductor die 101b.

The die-die interconnection structure of MCM package 100 is defined by electrical path PT shown in FIG. 1. In the example implementations, a conductive pillar 130 along the electrical path PT is interposed between semiconductor die 101a and semiconductor die 101b in a space between vertical plane L1 and vertical plane L2 in MCM 100. The conductive pillar 130 may extend vertically between plane P5 and plane P3 from die interconnect 150AB of die 101a to drain coupling portion 145B of die 101b. Conductive pillar 130 may establish or complete the electrical path PT between source 101as of die 101a and drain 101bd of die 101b. Electrical path PT between source 101as of die 101a and drain 101bd of die 101b may, for example, pass through source coupling portion 155A2, a first conductive connection layer portion (i.e., die interconnect 150AB), a first conductive layer portion (i.e., drain coupling portion 145B), the conductive pillar 130, and/or a conductive spacer pad 135A.

The conductive spacer pad 135A has a first portion disposed between the pillar 130 and the die interconnect 150AB and has a second portion disposed between the source coupling portion 155A2 and the die interconnect 150AB. The conductive spacer pad 135A has a length that is the same as that of the die interconnect 150AB. In some implementations, the length of the conductive spacer pad 135A can be different from (e.g., shorter than, longer than) the length the die interconnect 150AB.

The conductive pillar 130 may be made of metal or metallic alloy (e.g., electroless or electroplated copper). In this implementation, the conductive pillar 130 (e.g., made of copper) may be coupled to, or include, at least a portion of the conductive spacer pad 135A. Conductive spacer pad 135A may, for example, be a gold, a silver, or a gold-silver layer. In some implementations, the conductive spacer pad 135A can function as an etch stop layer in a process for fabricating the MCM package 100 (e.g., process 600A discussed below with reference to FIG. 6a). In some implementations, the conductive spacer pad 135A may be horizontally aligned with plane P5 at a base of copper pillar 130. In the example implementation shown in FIG. 1, the conductive spacer pad 135A has a horizontal width (like that of copper pillar 130) extending between vertical planes L1 and L2. In an example implementation (shown in FIG. 3m), conductive spacer pad 135A may extend beyond vertical plane L2 toward source coupling portion 155A2 along plane P5. A distance A1 is between planes P1 and a top surface of the conductive spacer pad 135A.

As previously mentioned, in the MCM package 100, semiconductor die 101a and 101b may be attached or encapsulated together by molding (e.g., molding 160) in a molded body portion 165 of MCM package 100. In the example implementations, the molding 160 may include materials that fill interstitial spaces (or openings) in and around the various components (semiconductor die, die-die interconnection structure, etc.) of the MCM package 100 between plane P1 and plane P5 to form molded body portion 165 of MCM package 100. Molding compounds used in molding 160 to form molded body portion 165 may, for example, include an insulating curable material, paste, or epoxy. In an example implementation, the molding compound may, for example, be an acid anhydride type with a filler size average of about 3 μm.

In some implementations, molding 160 may include molding portions (e.g., molding portion 160-1, molding portion 160-2, molding portion 160-3 etc.), which surround or embed conductive pillar 130 that is disposed between vertical plane L1 and vertical plane L2 in MCM 100. The molding portions (e.g., molding portion 160-1 and molding portion 160-2, etc.) surrounding or embedding conductive pillar 130 may, for example, provide mechanical or structural support to conductive pillar 130 in MCM package 100.

As shown in FIG. 1, the molding portion 160-1 is disposed between the semiconductor die 101a, 101b. The molding portion 160-1 extends vertically across the entirely of the molded body portion 165 from plane P1 (defined by the conductive layer) and plane P5 (defined by the interface between the second conductive coupling layer 155 and the conductive connection layer 150). The die interconnect 150AB is disposed below the molding portion 160-1. Specifically, the die interconnect 150AB spans the molding portion 160-1 between the semiconductor die 101a, 101b. Also, as shown in FIG. 1, the electrical path PT is routed around the molding portion 160-1.

In some implementations, some processes for fabricating MCM packages (e.g., process 600B discussed below with reference to FIG. 6b) may not involve use of an etch stop layer (e.g. conductive spacer pad 135A). When fabricating MCM package 100 shown in FIG. 1, a fabrication process that does not involve use of an etch stop layer (e.g., conductive spacer pad 135A) may cause an over etch recess in conductive pillar 130 (that is made of metal or metallic alloy). The over etch recess in conductive pillar 130 may be back filled with conductive paste or epoxy to maintain mechanical and electrical continuity of conductive pillar 130 with die interconnect 150AB. The conductive paste or epoxy used for back fill may be the same conductive paste or epoxy that is used to make die interconnect 150AB.

Although not shown in FIG. 1, a back metal layer (e.g., a thin back metal layer, a Ti/Ni/Ag layer) may be disposed on or along side 111a of semiconductor die 101a and side 111b of semiconductor die 101b for drain contacts. In some implementations, the thin back metal layer may be no greater than 1 micron thick.

Figure 2A:
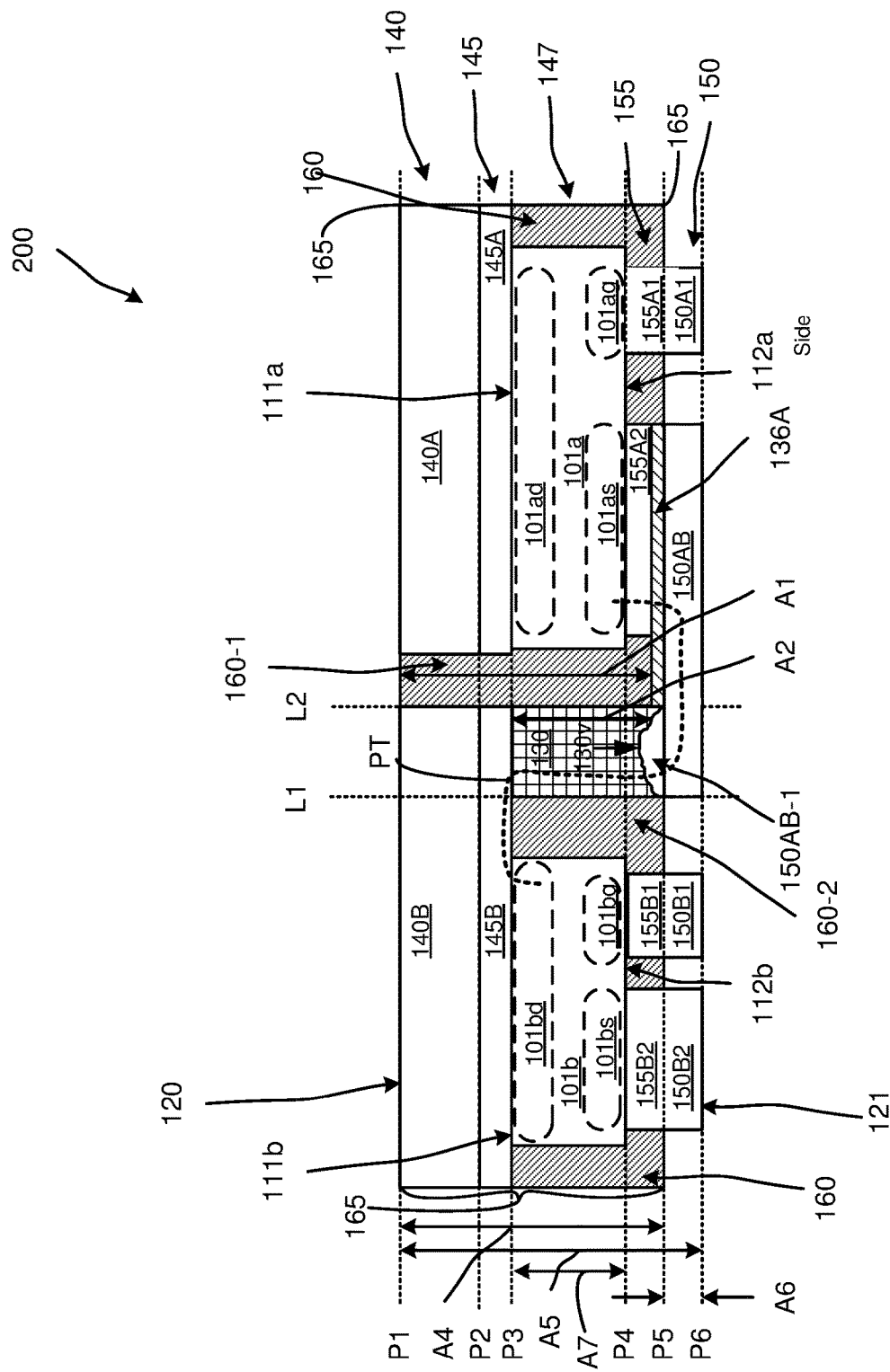
FIGS. 2a and 2b are schematic illustrations, in cross-sectional view, of variations of the example MCM package shown in FIG. 1.

FIG. 2a shows an example MCM package 200 in which conductive pillar 130 has an over etch recess (e.g., etch recess 130r). The MCM package 200 can be a variation of the MCM package 100 shown in FIG. 1.

In the MCM package 200 (which otherwise has the same or similar components distributed in inter-planar layers as MCM package 100), conductive pillar 130 includes a recess-filling coupling portion extension 150AB-1 that provides mechanical and electrical continuity between die interconnect 150AB and conductive pillar 130. In some implementations, coupling portion extension 150AB-1 may, for example, be made of the same electrically conductive materials as die interconnect 150AB.

As shown in FIG. 2a, in MCM package 200, electrical path PT between source 101as of die 101a and drain 101bd of die 101b extends, for example, through source coupling portion 155A2, the die interconnect 150AB, coupling portion extension 150AB-1, the pillar 130, and/or drain coupling portion 145B.

In this implementation, the conductive pillar 130 (e.g., made of copper) may be lateral to a conductive spacer pad 136A. In other words, the conductive spacer pad 136A may be lateral to the conductive pillar 130. The conductive spacer pad 136A does not have a portion disposed below the conductive pillar 130 and has a portion disposed between the source coupling portion 155A2 and the die interconnect 150AB. In some implementations, the conductive spacer pad 136A can function as an etch stop layer in a process for fabricating the MCM package 200.

Figure 2B:
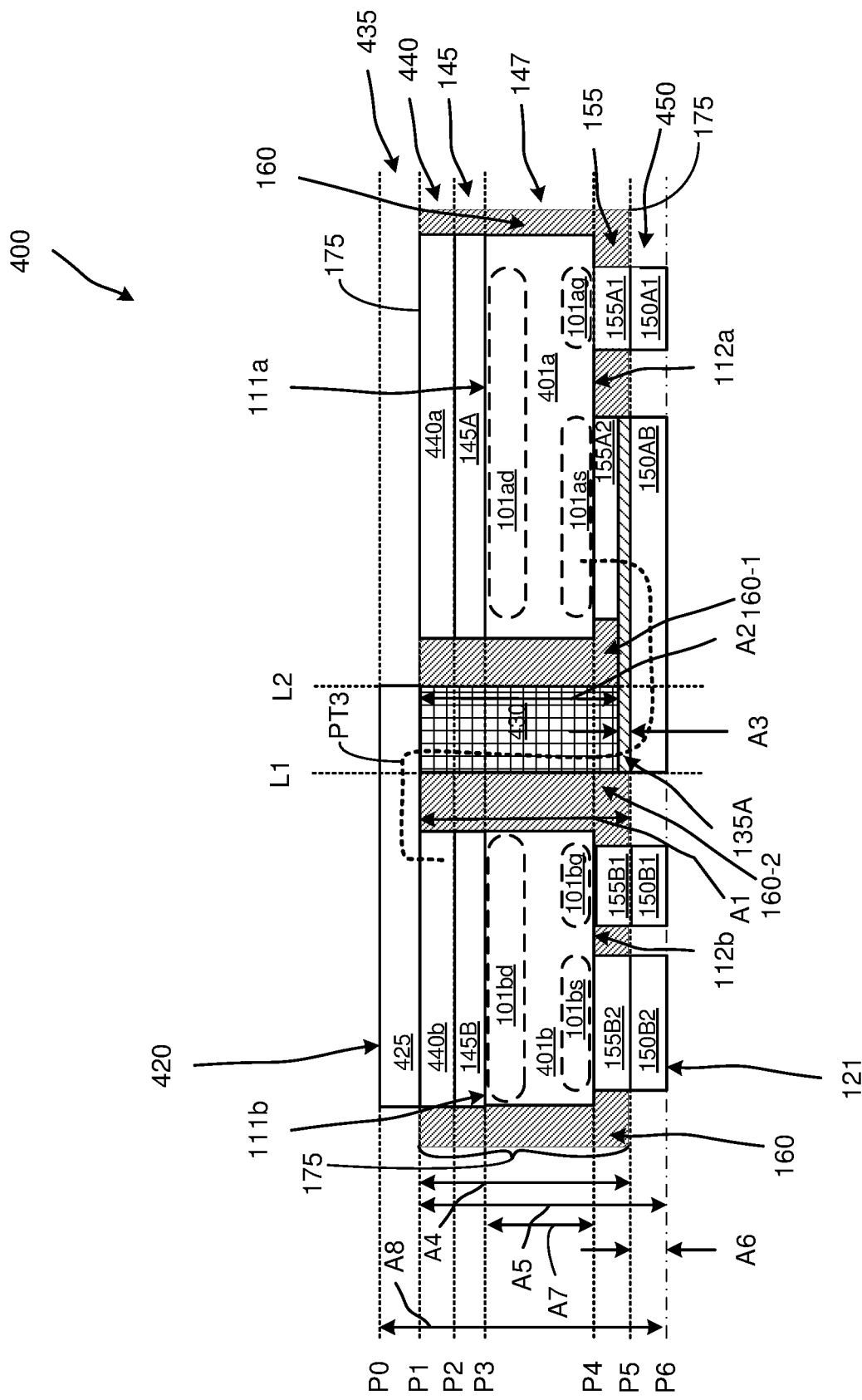

FIG. 2b is a schematic illustration, in cross-sectional view, of another example MCM package (e.g., MCM package 400) including a pair of semiconductor die (e.g., die 401a and 401b). The MCM package 400 shown in FIG. 2b can be a variation of the MCM package 100 shown in FIG. 1. The MCM package 400 has the same or similar components distributed in inter-planar layers as MCM package 100 unless otherwise noted. In MCM package 400, semiconductor die 401a and 401b, like the die in MCM package 100, may be attached or held together by molding 160 including molding portion 160-1 and molding portion 160-2, etc., for example, in a molded body portion 175 of MCM package 400.

Similar to the example shown in FIG. 1, the MCM package 400 has horizontal planes P0, P1, P2, P3, P4, P5 and P6 and vertical planes L1 and L2. The MCM package 400 has a top surface (e.g., a first outer surface 120) aligned along plane P0 and a bottom surface (e.g., a second outer surface 121) aligned along plane P6. First outer surface 120 (plane P0) and second outer surface 121 (plane P6) have a distance A8. The MCM package 400 has a low profile with the distance A8 between the first outer surface 120 (plane P0) and the second outer surface 121 (plane P6) less than 1.0 mm (e.g., a thickness of less than 0.75 mm). The MCM package 400 includes a first conductive connection layer 435 (between plane P0 and P1), a conductive layer 440 (between plane P1 and P2), a first conductive coupling layer 145 (between plane P2 and P3), a die layer 147 (between plane P3 and P4), a second conductive coupling layer 155 (between plane P4 and P5), a second conductive interconnection layer 450 (between plane P5 and P6).

As shown in FIG. 2b, the first conductive connection layer 435 and the second conductive connection layer 450 are disposed outside of the molded body portion 165. The first conductive connection layer 435 and the second conductive connection layer 450 are disposed on opposite sides of the molded body portion 175.

The MCM package 400 shown in FIG. 2b includes semiconductor die 401a and semiconductor die 401b disposed in the die layer 147 between planes P3 and P4. Sides 111a and 111b may be aligned with plane P3, while sides 112a and 112b may be aligned with plane P4. In MCM package 400, a drain back metal 440a and a drain back metal 440b are disposed in conductive layer 440 between plane P1 and plane P2. The drain back metal 440a and the drain back metal 440b are electrically coupled to the semiconductor die 410a, 410b, respectively, via the first conductive coupling layer 145.

Further, in accordance with the principles of the present disclosure, MCM package 400 has a die-die interconnection structure that is included, at least in part, between the first outer surface 120 and the second outer surface 121 of MCM package 400. The die-die interconnection structure electrically connects source 101as of semiconductor die 401a with drain 401bd of semiconductor die 401b. The die-die interconnection structure may, for example, include at least a die interconnect 425, a conductive pillar 430, and the die interconnect 150AB.

In some implementations, die interconnect 425 may be disposed in first conductive interconnection layer 435 between plane P0 and plane P1. Die interconnect 425 may be in electrical contact with drain back metal 440b and conductive pillar 430 along plane P1. Conductive pillar 430 may be interposed between semiconductor die 401a and semiconductor die 401b in a space between vertical plane L1 and vertical plane L2 in MCM 400. Conductive pillar 430 in conjunction with die interconnect 425 may establish or complete an electrical path (which is schematically shown as electrical path PT3 in FIG. 2b) between source 101as of die 401a and drain 101bd of die 401b. As shown in FIG. 2b, electrical path PT3 between source 101as of die 401a and drain 101bd of die 401b may, for example, pass through source coupling portion 155A2, the conductive spacer pad 136A, die interconnect 150AB, conductive pillar 430, die interconnect 425, and drain back metal 440b.

In some implementations, conductive pillar 430 may extend vertically between plane P5 and plane P1 from die interconnect 150AB (of die 101a) to die interconnect 425 (of die 101b). In some implementations, conductive pillar 430 extends vertically across the entirety of the molded body portion 175. In some implementations, conductive pillar 430 may be made of metal or metallic alloy (e.g., electroless or electroplated copper). In some implementations, conductive pillar 430 (e.g., made of copper) may be coupled to, or include, at least a portion of a conductive spacer pad 135A. As described above, conductive spacer pad 135A may function as an etch stop layer. In some implementations, conductive spacer pad 135A may be horizontally aligned with plane P5 at a base of conductive pillar 430. In some implementations, conductive pillar 430 and the conductive spacer pad 135A may collectively extend vertically along the entirety of the molded body portion 175.

In this implementation, the conductive pillar 430 is disposed between molding portions 160-1 and 160-2. Each of the molding portions 160-1 and 160-2 extend vertically across the entirety of the molded body portion 175. In some implementations, one or more of the molding portions 160-1 and 160-2 can be recessed. In other words, a cavity (with an opening) can be defined within molding portion 160-1 and/or molding portion 160-2.

Example processes for fabricating example MCM packages described in connection with FIGS. 1 through 2b are described with reference to at least FIGS. 3a through 6c. The process for packaging multiple semiconductor die in an MCM package may be referred to as a packaging process. The MCM package at the various steps of the packaging process may be referred to as the packaging structure (at the particular step). While like reference characters or numerals are used to label like elements throughout the various drawings, some of the elements are not labeled in some of the figures for visual clarity in views and simplicity in description. The processes may involve photoresist coating, lithographic patterning, screen printing, deposition, solder bumps, molding, and removal of materials on (or of) the substrate, etc. The packaging process steps may involve photoresist coating, lithographic patterning, screen printing, deposition, solder bumps, molding, and removal of materials on (or of) the substrate, etc.

FIGS. 3a-3m show cross-sectional views of multiple semiconductor die and a temporary carrier substrate being processed through steps of a process for assembling the multiple semiconductor die in MCM packages (e.g., MCM package 100, FIG. 1).

In the example shown in FIGS. 3a-3m, process 300 is used to assemble a pair of semiconductor die 101a and 101b (as shown in FIG. 1) in a single MCM package. The semiconductor die 101a and 101b have solder bump and printed source and gate contact pads (e.g., source coupling portion 155A2, gate coupling portion 155A1, etc.) In the context of this process described in FIGS. 3a-3i, the MCM package may not include a back metal layer.

Figure 3A:
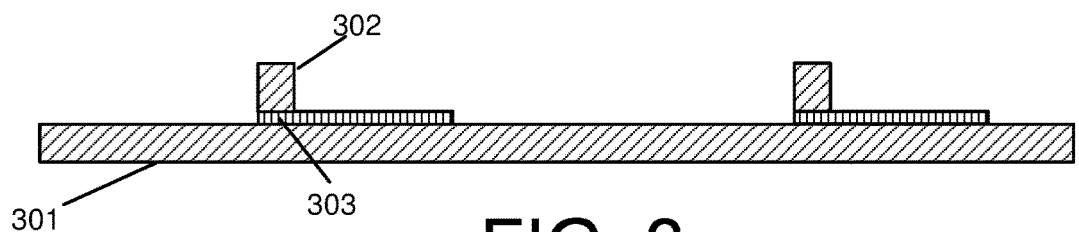
FIGS. 3a through 3m illustrate cross-sectional views of a pair of semiconductor die through multiple steps of an MCM packaging process.

As shown in FIG. 3a, the process begins with a temporary carrier substrate. The temporary carrier substrate may be a copper substrate (e.g., a copper substrate 301) on which conductive pillars 302 (e.g., pillars 130, FIG. 1) are formed. Copper substrate 301 may be a carrier (or similar to a carrier) that is used in land grid array (LGA) packaging of integrated circuit chips. The conductive pillars (e.g., pillars 302) may be structures formed on copper substrate 301 by electroless or electro plated deposition of copper on a pattern of conductive spacer pads 303 (e.g., conductive spacer pads 135A, FIG. 1). A conductive spacer pad 303 may be made of gold, silver, or a gold-silver alloy, and may serve as an etch stop layer in process 300.

Figure 3B:
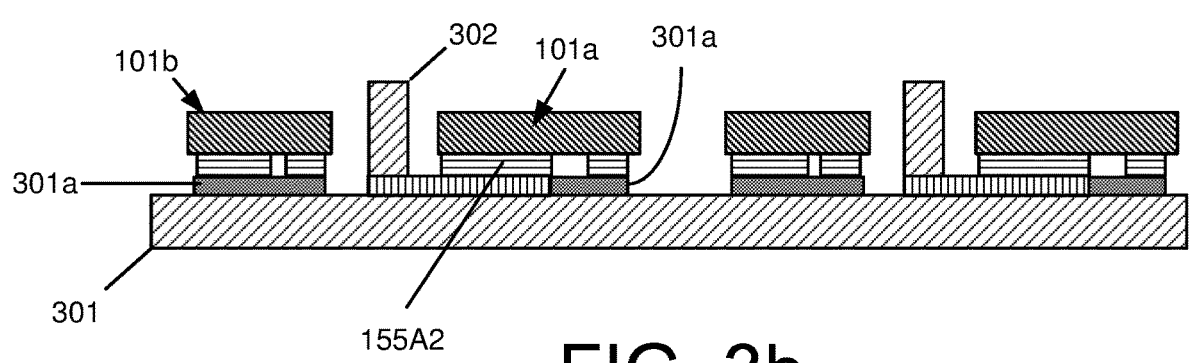
Figure 3C:
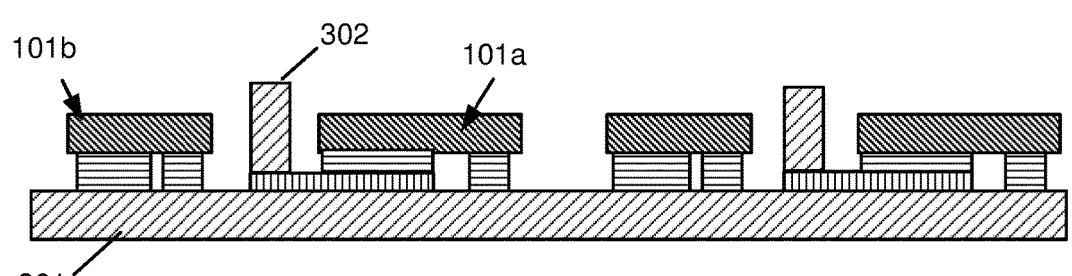

As shown in FIG. 3b, the semiconductor die (e.g., die 101a and 101b) may be attached to copper substrate 301 between pillars 302. In an example implementation, the die are attached to copper substrate 301 using flux 301a, for example, in a flip chip configuration, for subsequent bonding by reflow and molding. FIG. 3c shows the semiconductor die (e.g., die 101a and die 101b) bonded to copper substrate 301 about a pillar 302 (and between pillars 302) after flux reflow.

Figure 3D:
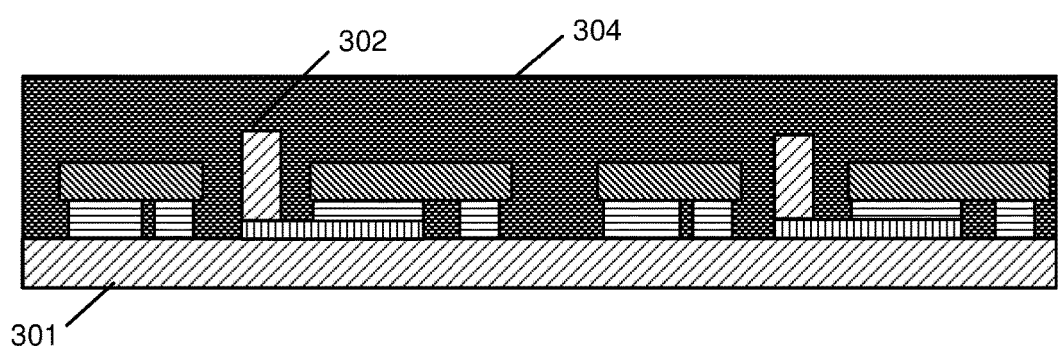

The process may further include molding the semiconductor die (e.g., die 101a and die 101b) bonded to copper substrate 301 between pillars 302. A molding compound (e.g., an acid anhydride with a filler size of 3 microns) may be applied over the carrier substrate to fill inter component spaces and cover the die and pillars on copper substrate 301. FIG. 3d shows molding 304 (e.g., a portion of molding 160, FIG. 1) covering the components (the die and pillars) on copper substrate 301.

Figure 3E:
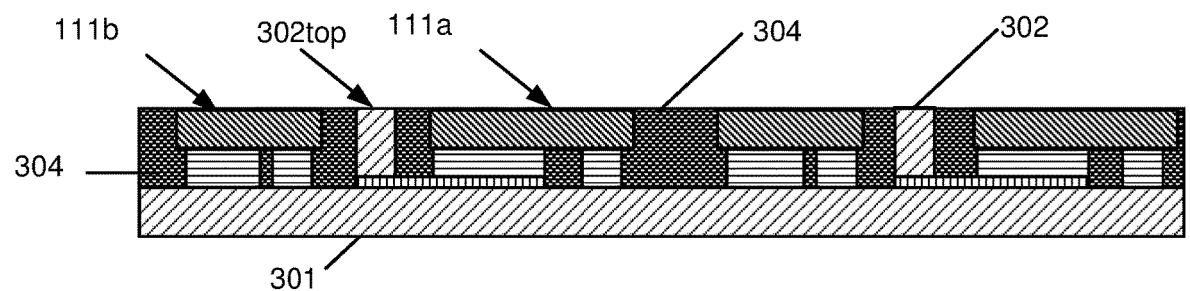

Back grinding may be used to remove molding 304 covering the components on copper substrate 301 to expose top surfaces (e.g., surface 111a and surface 111b) and a top face (e.g., face 302top) of pillar 302. FIG. 3e shows an example of the packaging structure after back grinding where at least a portion of the molding is removed.

Figure 3F:
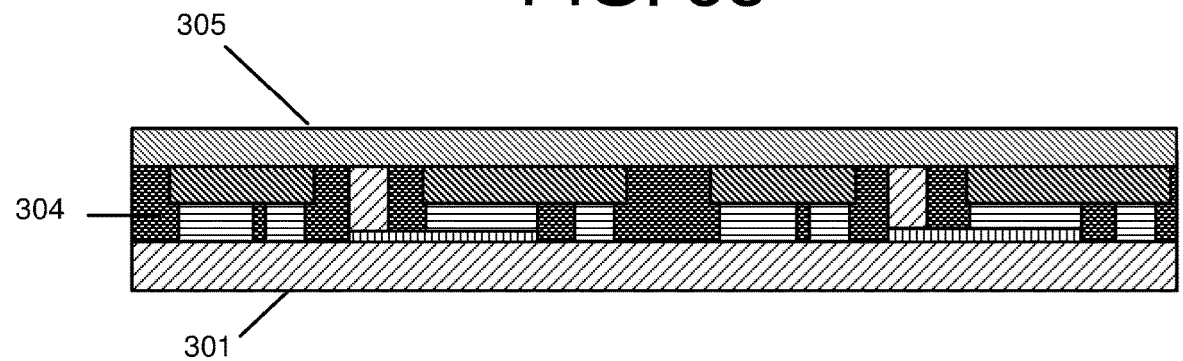

As shown in FIG. 3f, a conductive adhesive layer 305 (e.g., a wafer back coating (WBC) layer or other material) may be applied to the packaging structure over the exposed top surfaces (e.g., surface 111a and surface 111b) of the dies and the top face (e.g., face 302top) of pillar 302.

Figure 3G:
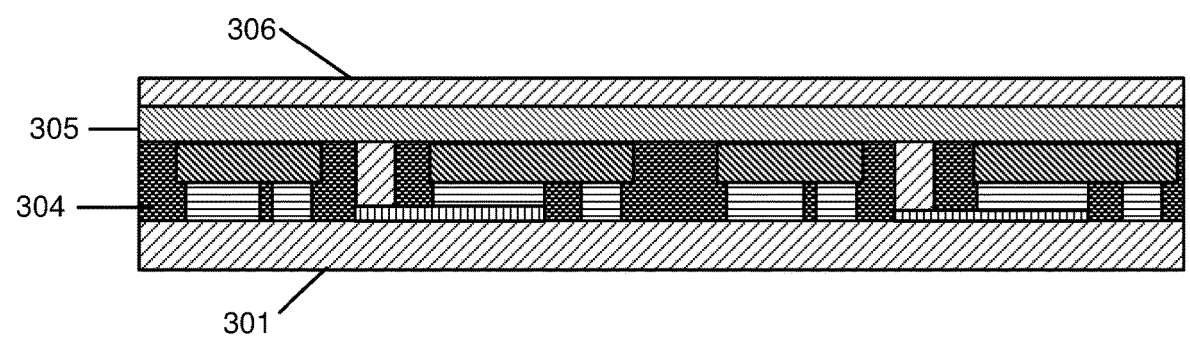

As shown in FIG. 3g, a metal sheet (e.g., copper plate 306) may be disposed over the packaging structure and attached to packaging structure by reflow (e.g., of conductive adhesive layer 305). Copper plate 306 and conductive adhesive layer 305 form a conductive coupling layer (e.g., conductive coupling layer 145, FIG. 1) that can be patterned to form drain contact elements and pillar-to-drain interconnection elements (e.g., drain coupling portion 145A, outer conductive plate 140A, drain coupling portion 145B, and outer conductive plate 140B, FIG. 1) in the packaging structure.

Figure 3H:
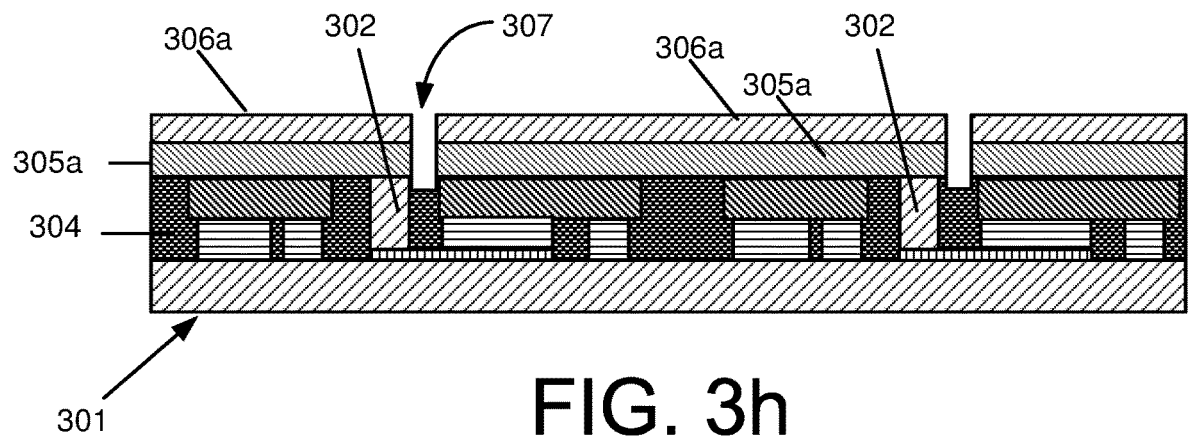

As shown in FIG. 3h, grooves or openings (e.g., opening 307) may be defined (e.g., cut) through copper plate 306 and conductive adhesive layer 305 to electrically isolate sets of semiconductor die (e.g., die 101a and die 101b) to be contained in individual MCM packages. Opening 307 cuts through copper plate 306 and conductive adhesive layer 305 to form copper plate segments 306a and conductive adhesive layer segments 305a, each of which span a pair of dies (e.g., die 101a and die 101b) between adjacent pillars 302.

Figure 3I:
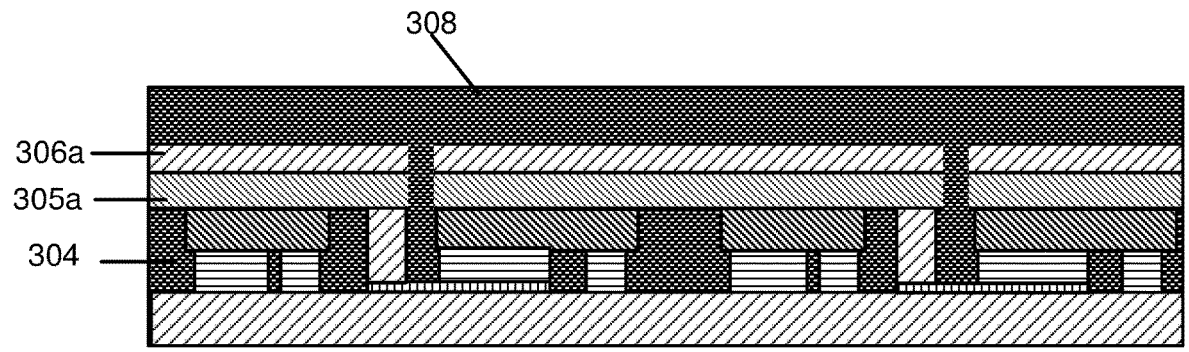
Figure 3J:
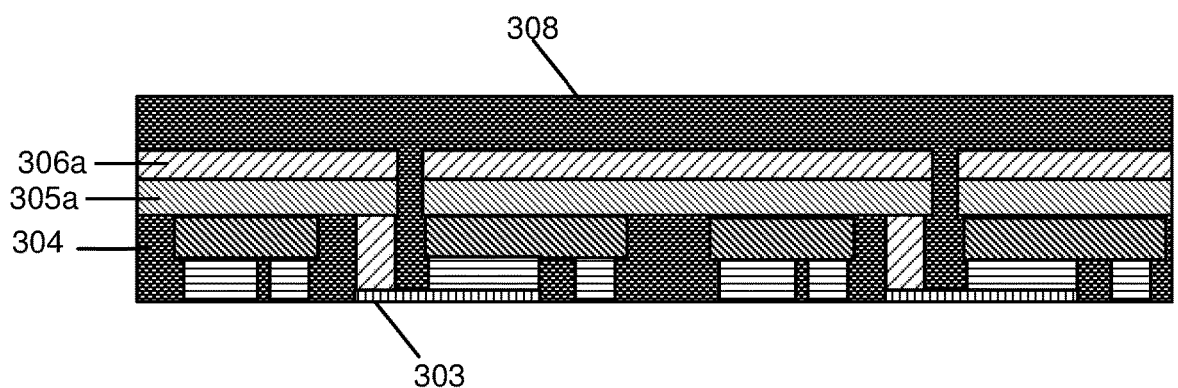

As shown in FIG. 3i, a molding 308 (e.g., a portion of molding 160, FIG. 1) may be applied to cover the packaging structure having openings 307 that isolate sets of semiconductor die (e.g., die 101a and die 101b) to be contained in individual MCMs. As shown in FIG. 3j, the temporary carrier substrate (i.e., copper substrate 301) may be removed from the packaging structure, for example, by etching, up to the etch stop layer (i.e., conductive spacer pad 303).

Figure 3K:
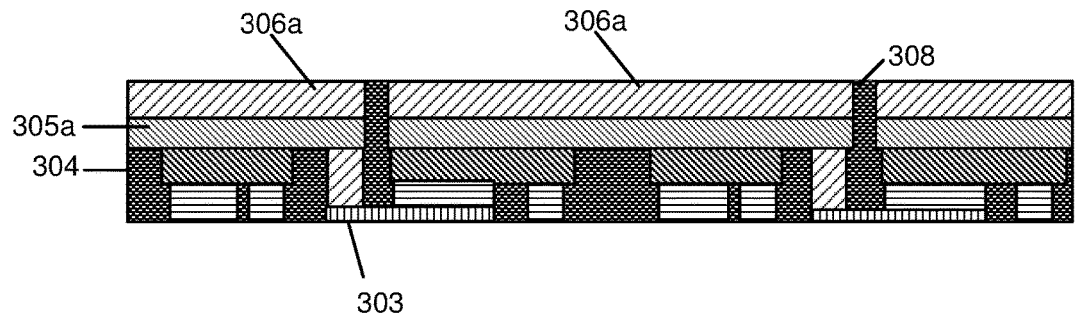

As shown in FIG. 3k, molding 308 covering the packaging structure is removed (e.g., by back grinding) to re-expose copper plate segments 306a. A portion of molding 308 may remain in openings 307 as a plug (e.g., molding portion 160-3, FIG. 1) between the semiconductor die (e.g., die 101a and die 101b).

Figure 3L:
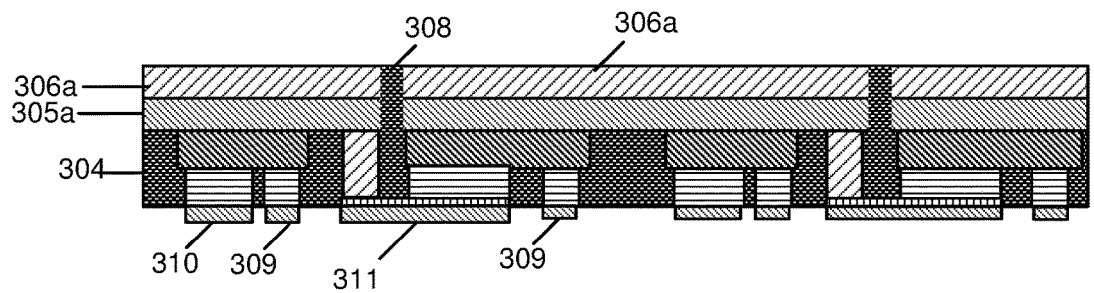

As shown in FIG. 3l, screen printing and reflow may be used to pattern gate contact pads 309 for die 101a and 101b (e.g., gate contact pad 150A1 and gate contact pad 150B1, FIG. 1), source contact pad 310 for die 101b (e.g., source contact pad 150B2, FIG. 1) and source contact pad 311 for die 101a (e.g., source contact pad 150AB, FIG. 1). Source contact pad 311 for die 101a electrically connects the source of die 101a to a base of pillar 130.

Figure 3M:
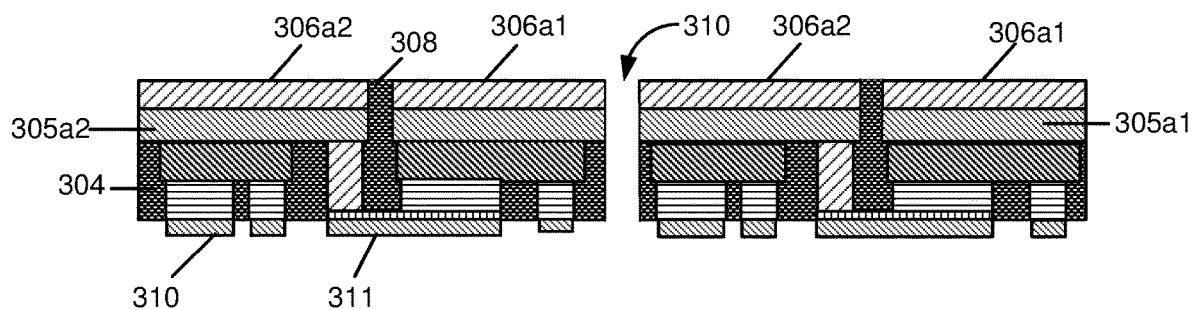

As shown in FIG. 3m, individual MCM packages may be singulated by cutting the packaging structure along saw cuts 312. The singulating saw cuts 312 divide copper plate segments 306a and conductive adhesive layer segments 305a into copper plate sub-segments 306a1 and conductive adhesive layer sub-segments 305a1 to form a drain contact (e.g., a drain coupling portion 145A, an outer conductive plate 140A, FIG. 1) over die 101a, and copper plate sub-segment 306a2 and conductive adhesive layer sub-segment 305a2 to form a drain contact (e.g., drain coupling portion 145B, outer conductive plate 140B, FIG. 1) over die 101b.

Each individual MCM package may include a first semiconductor die (101a) and a second semiconductor die (101b) with a source of the first semiconductor die connected to a drain of the second semiconductor die via copper pillar 302 that is supported in place by molding 304 and 308. Source contact pad 311 (e.g., source contact pad 150AB, FIG. 1) electrically connects the source of die 101a to copper pillar 302. Copper plate sub-segment 306a2 (e.g., outer conductive plate 140B, FIG. 1) and conductive adhesive layer sub-segment 305a2 (e.g. drain coupling portion 145B, FIG. 1) electrically connect copper pillar 302 the drain of die 101b.

In the example process shown in FIGS. 4a-4m, a pair of semiconductor die 401a and 401b (FIG. 2b) are assembled in a single MCM package. The semiconductor die 401a and 401b may include semiconductor substrates that have solder bump and printed source and gate contact pads (e.g., source coupling portion 155A2, gate coupling portion 155A1, etc., FIG. 2b). The MCM package may further include a back metal structure 402 (including, e.g., conductive coupling pad 410a, drain back metal 440a, etc., as shown in FIG. 2b) disposed on or along side 111a and side 111b for drain contacts. In some implementations, the back metal structure may include a Ti/NiV/Ag stack (e.g., about 1 micron thick) and a copper layer and/or a copper-nickel bi layer (e.g., about 5 to 10 µm thick).

Figure 4A:
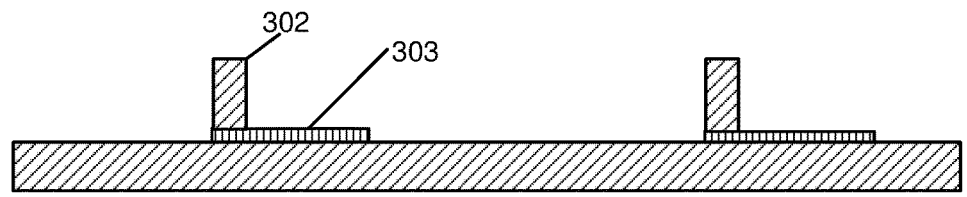
FIGS. 4a through 4i illustrate cross-sectional views of a pair of semiconductor die through multiple steps of another MCM packaging process.
Figure 4B:
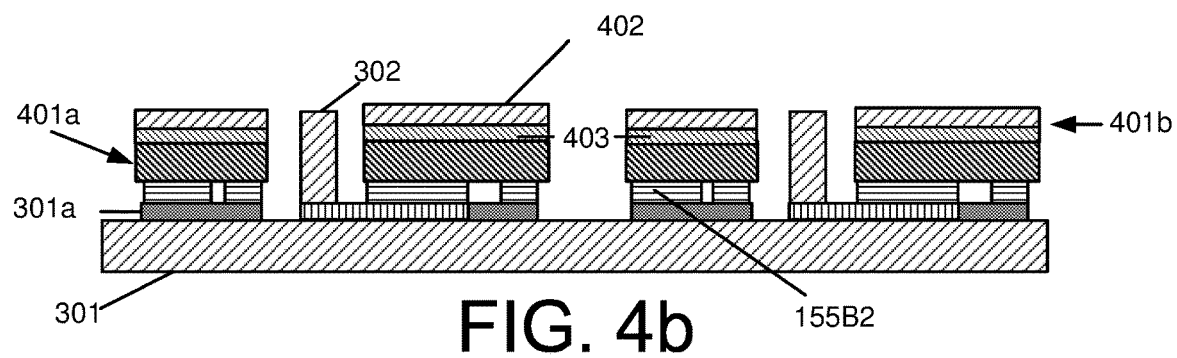

FIG. 4a illustrates a temporary carrier substrate (e.g., a copper substrate 301 on which copper pillars 302 (e.g., pillars 130, FIG. 2b) are formed by electroless or electro plated deposition of copper on a pattern of conductive spacer pads 303 (e.g., conductive spacer pads 135A, FIG. 2b). As shown in FIG. 4b, the semiconductor die (e.g., 401a and 401b) may be attached to copper substrate 301 around a pillar 302 (and between pillars 302). In an example implementation, the die are attached to copper substrate 301 using flux 301a, for example, in a flip chip configuration, for subsequent bonding by reflow and molding.

Figure 4C:
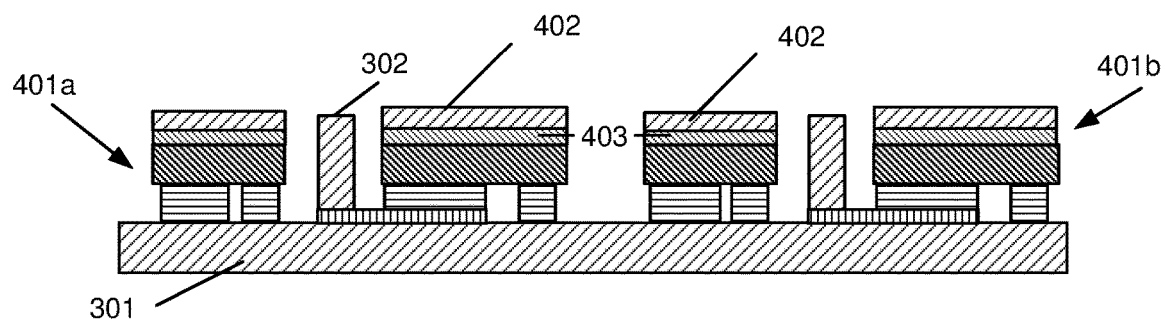

FIG. 4c, shows the semiconductor die (e.g., die 401a and die 401b) bonded to copper substrate 301 between pillars 302 after flux reflow. The process further includes molding the semiconductor die (e.g., die 401a and die 401b) bonded to copper substrate 301 between pillars 302.

Figure 4D:
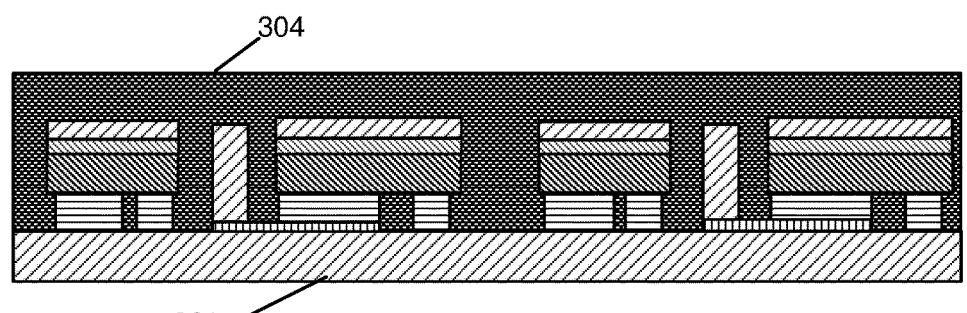
Figure 4E:
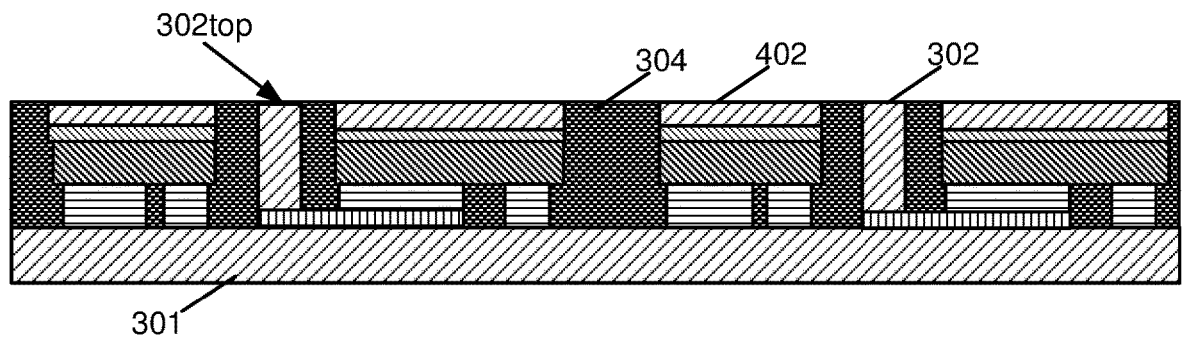

FIG. 4d shows molding 304 (e.g. a portion of molding 160, FIG. 2b) covering the components (the die and pillars) on copper substrate 301. Back grinding may be used to remove molding 304 covering the components on copper substrate 301 and grind the packaging structure to a back metal structure 402. The back grinding exposes back metal structure 402 (e.g., drain back metal 440a and drain back metal 440b, FIG. 2b) and a top face (e.g., face 302top) of pillar 302. FIG. 4e shows an example of the packaging structure after the back grinding.

Figure 4F:
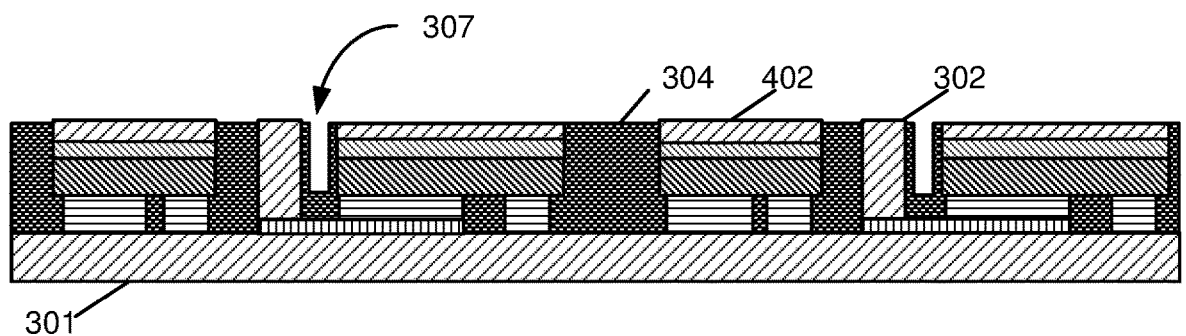

As shown in FIG. 4f, grooves or openings (e.g., opening 307) may be cut through surface 402, for example, to isolate sets of semiconductor die (e.g., die 401a and die 401b) to be contained in individual MCMs.

Figure 4G:
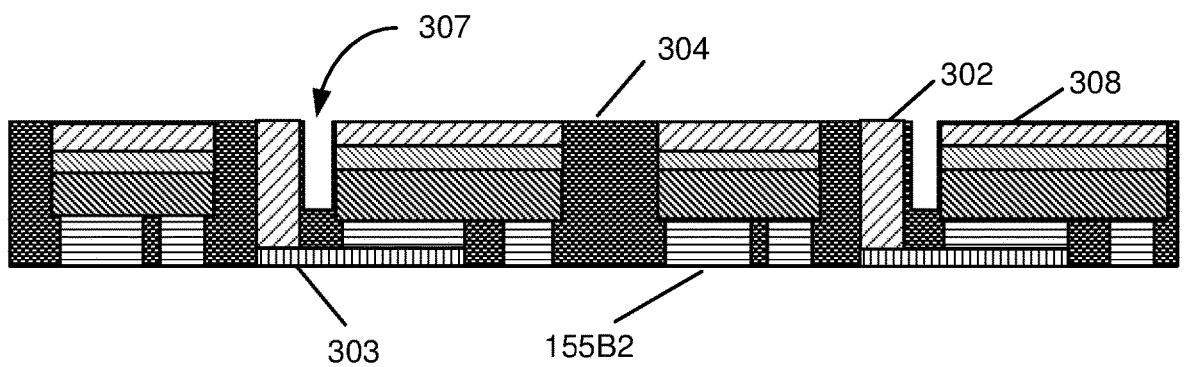

As shown in FIG. 4g, the temporary carrier substrate (i.e., copper substrate 301) may be removed from the packaging structure, for example, by etching, up to the etch stop layer (i.e., conductive spacer pad 303).

Figure 4H:
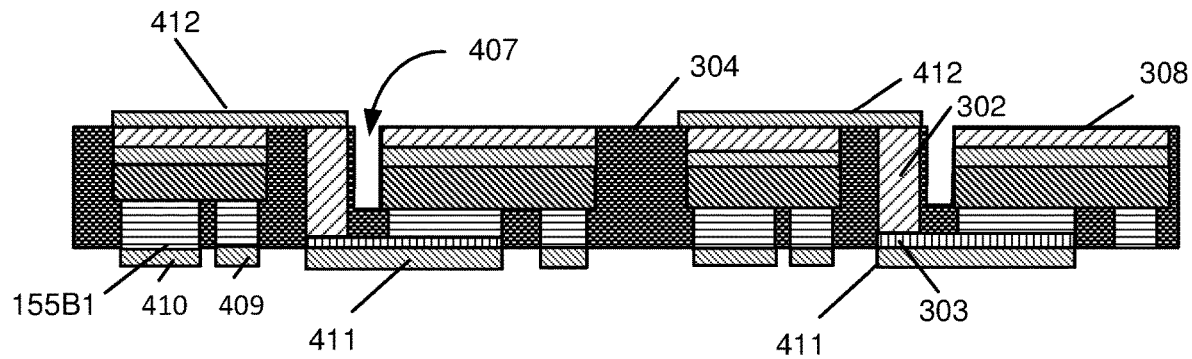

As shown in FIG. 4h, screen printing and reflow can be used to form a drain contact pad 412 (e.g., die interconnect 425, FIG. 2b) for die 401b, gate contact pads 409 (e.g., gate contact pads 150A1 and 150B1, FIG. 2b) for die 401a and 401b, source contact pad 410 (e.g., source contact pad 150B2, FIG. 2b) for die 401b, and a source contact pad 411 (e.g., source contact pad 150AB, FIG. 2b) for die 401a. Drain contact pad 412 for die 401b may electrically connect a drain of die 401b to a top of pillar 302. Source contact pad 411 for die 101a may electrically connect the source of die 401a to a base of pillar 302.

Figure 4I:
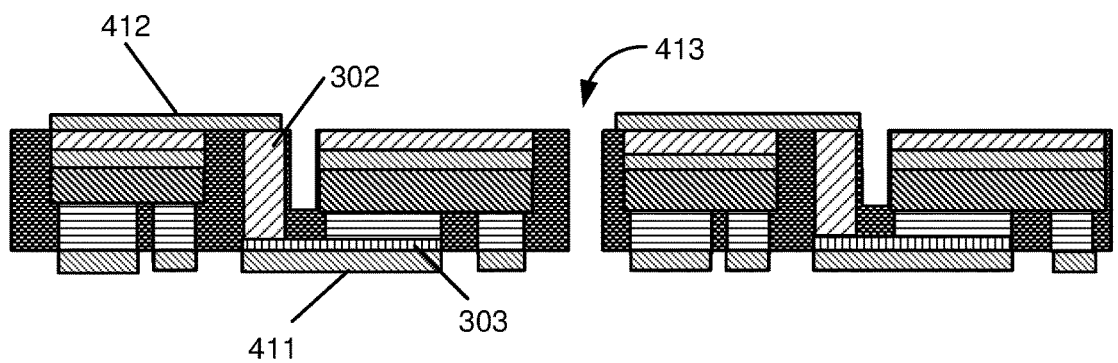

As shown in FIG. 4i, individual MCM packages may be singulated by cutting the packaging structure along saw cuts 413. Each individual MCM package may include a first semiconductor die (401a) and a second semiconductor die (401b) with a source of the first semiconductor die connected to a drain of the second semiconductor die via copper pillar 302 held in place in molding 304. Source contact pad 411 (e.g., source contact pad 150AB, FIG. 2b) electrically connects the source of die 401a to copper pillar 302. Drain contact pad 412 (e.g., die interconnect 425, FIG. 2b)) electrically connects copper pillar 302 the drain of die 401b.

FIGS. 5a-5m show cross-sectional views of multiple semiconductor die and a temporary carrier substrate being processed through steps of a process 500 for assembling the multiple semiconductor die in an MCM package (e.g., the MCM package 200 shown in FIG. 2a).

As shown in FIG. 5a-5m, a pattern of conductive spacer pads (e.g., conductive spacer pads 503) may be disposed on the copper substrate 501 along a side of pedestals 502 (but not into or underneath the pedestals 502). Like conductive spacer pad 303 in process 300 (FIG. 3k), conductive spacer pad 503 may be made of gold, silver, or a gold silver alloy and may serve as an etch stop layer in process 500.

Figure 5A:
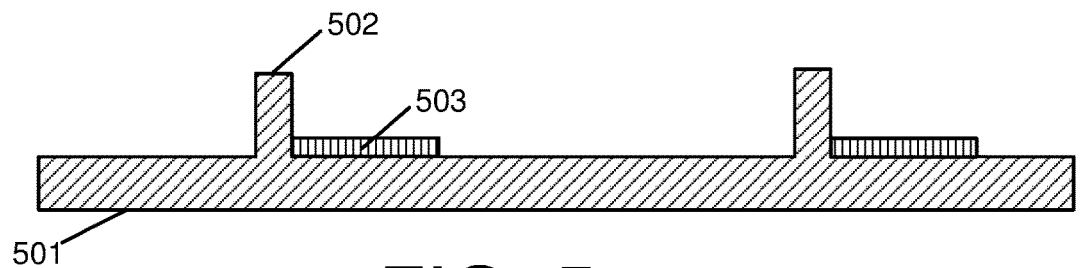
FIGS. 5a through 5m illustrate cross-sectional views of a pair of semiconductor die through multiple steps of yet another MCM packaging process.

As shown in FIG. 5a, process 500 begins with a temporary carrier substrate formed by a lead frame metal stamping process. Copper substrate 501 may be a carrier (or similar to a carrier) that is used in lead frame packaging of integrated circuit chips. The conductive pillars (e.g., pedestals 502) may be structures formed on copper substrate 501 by the metal stamping process.

Figure 5B:
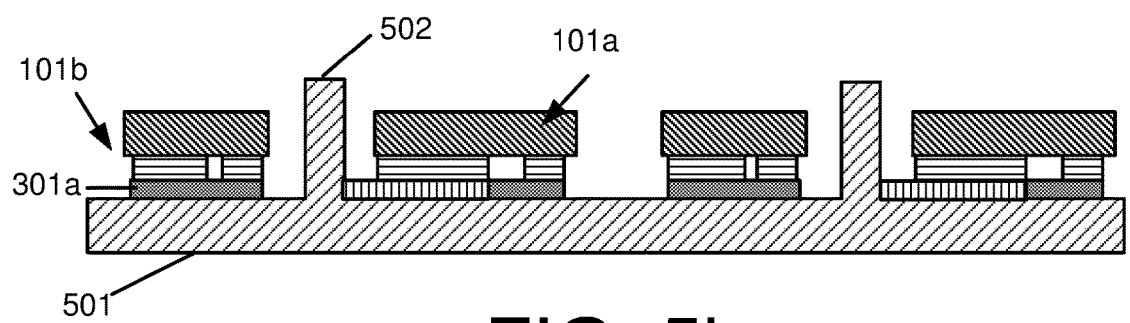

As shown in FIG. 5b, in process 500, the semiconductor die (e.g., die 101a and 101b) may be attached to copper substrate 501 between pedestals 502 of copper substrate 501. In an example implementation, the die are attached to copper substrate 501 using flux 301a, for example, in a flip chip configuration, for subsequent bonding by reflow and molding.

Figure 5C:
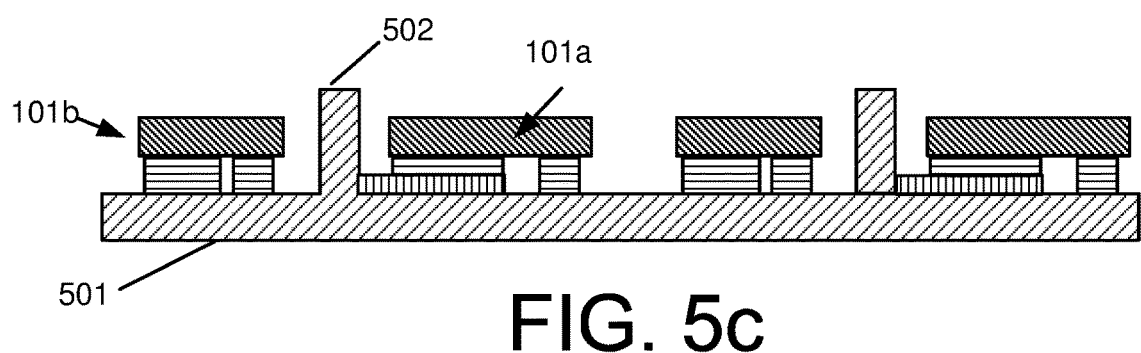

FIG. 5c, shows the semiconductor die (e.g., 101a and 101b) bonded to copper substrate 501 between pedestals 502 after flux reflow. The process may further include molding the semiconductor die (e.g., die 101a and die 101b) bonded to copper substrate 301 between pedestals 502. A molding compound (e.g., an acid anhydride with a filler size of 3 microns) may be applied over the carrier substrate to fill inter component spaces and cover the die and pedestals on copper substrate 501.

Figure 5D:
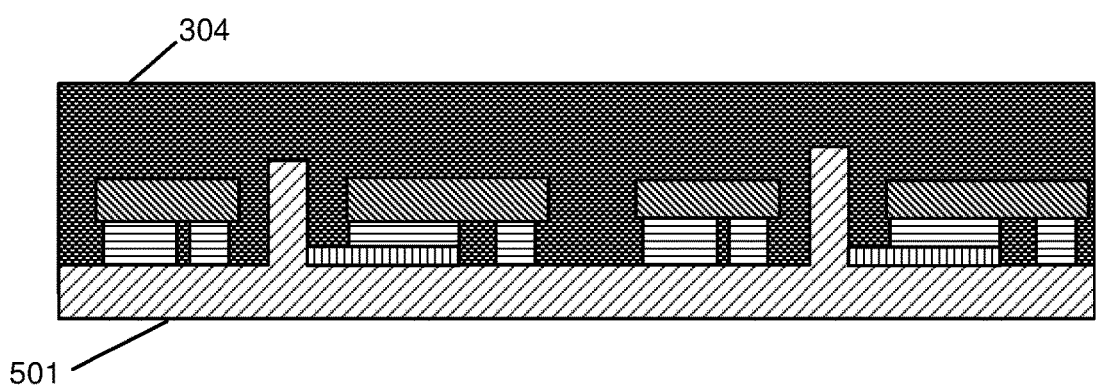
Figure 5E:
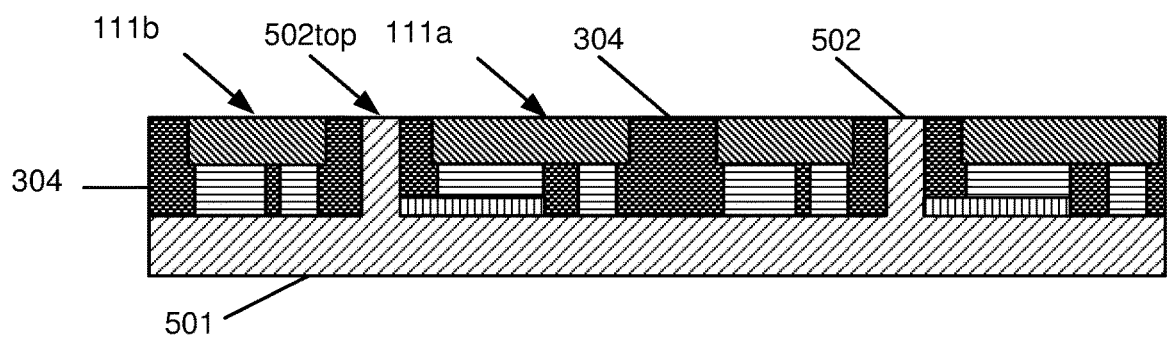

FIG. 5d shows molding 304 (e.g., a portion of molding 160, FIG. 2a) covering the components (the die and pedestals) on copper substrate 501. Back grinding may be used to remove molding 304 covering the components on copper substrate 501 to expose top surfaces (e.g., surface 111a and surface 111b) of the dies and a top face (e.g., face 502top) of pedestal 502. FIG. 5e shows an example of the packaging structure after the back grinding.

Figure 5F:
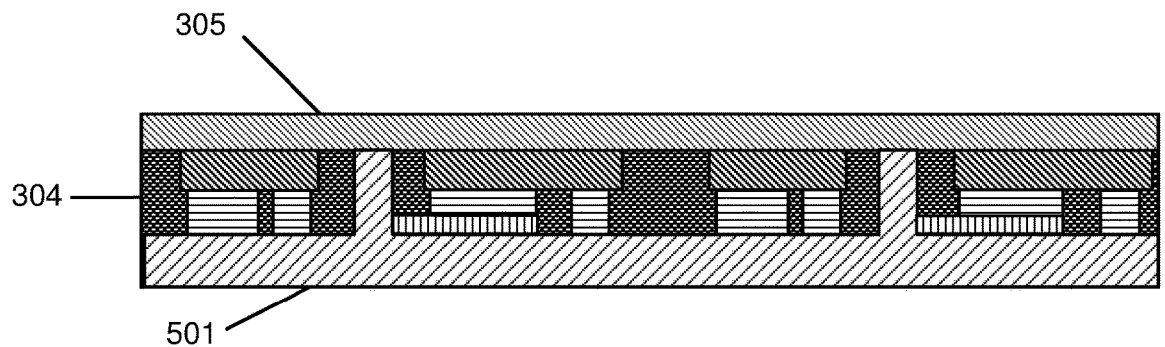
Figure 5G:
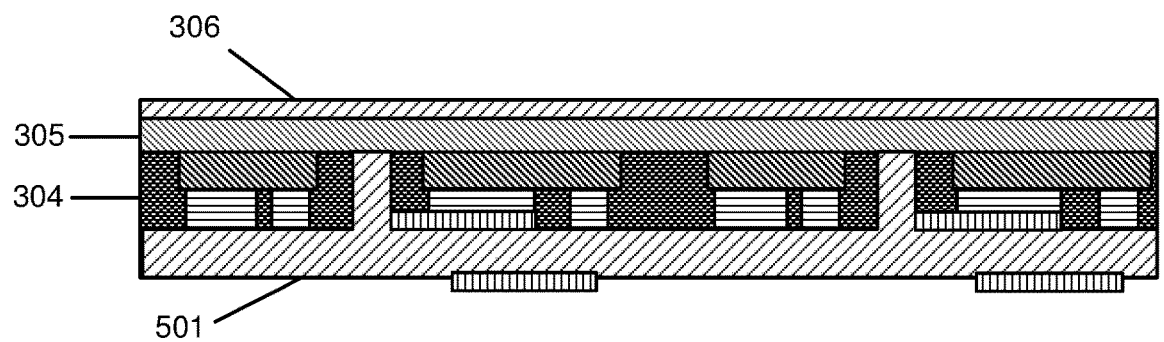

As shown in FIG. 5f, a conductive adhesive layer 305 (e.g., a wafer back coating (WBC) layer or other material) may be applied to the packaging structure over the exposed top surfaces (e.g., surface 111a and surface 111b) of the dies and the top face (e.g., face 502top) of pedestal 502. As shown in FIG. 5g, a metal sheet (e.g., copper plate 306) may be disposed over the packaging structure and attached to packaging structure by reflow (e.g., of the conductive adhesive layer 305).

Copper plate 306 and conductive adhesive layer 305 form a conductive coupling layer (e.g., conductive coupling layer 145, FIG. 2a) that can be patterned to form drain contact elements and pillar-to-drain interconnection elements (e.g., drain coupling portion 145A, outer conductive plate 140A, drain coupling portion 145B, and outer conductive plate 140B, FIG. 2b) in the packaging structure.

Figure 5H:
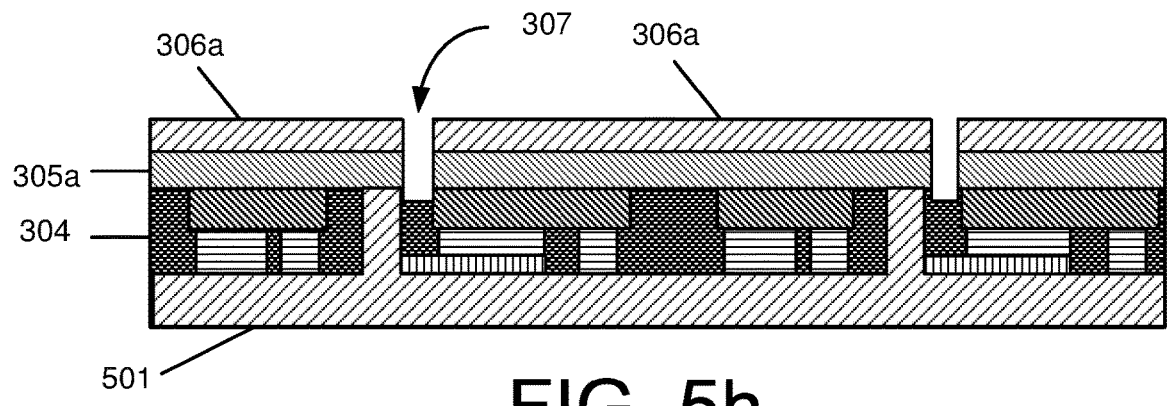

As shown in FIG. 5h, openings (e.g., opening 307) may be cut through copper plate 306 and conductive adhesive layer 305 to isolate sets of semiconductor die (e.g., die 101a and die 101b) to be contained in individual MCMs. Opening 307 cuts through copper plate 306 and conductive adhesive layer 305 to form copper plate segments 306a and conductive adhesive layer segments 305a, each of which span a pair of dies (e.g., die 101a and die 101b) between adjacent pedestals 502.

Figure 5I:
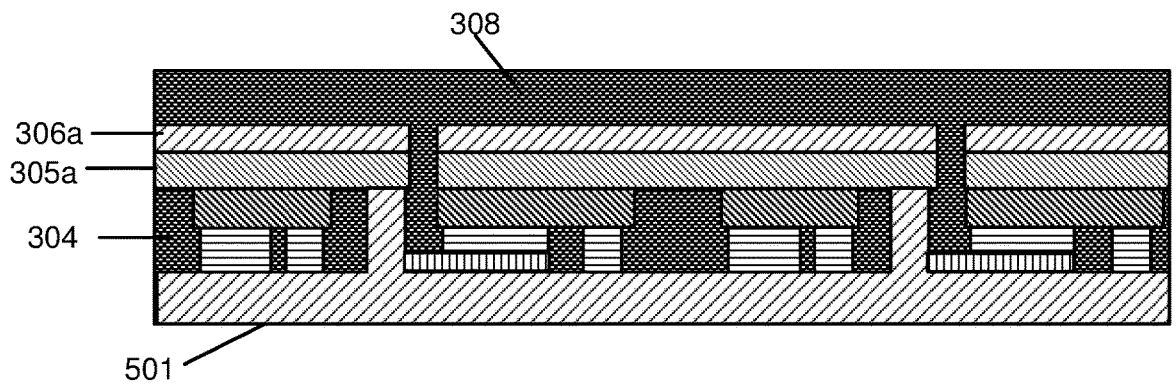

As shown in FIG. 5i, a molding layer (molding 308) may be applied to cover the packaging structure having openings 307 that isolate sets of semiconductor die (e.g., die 101a and die 101b) to be contained in individual MCMs.

Figure 5J:
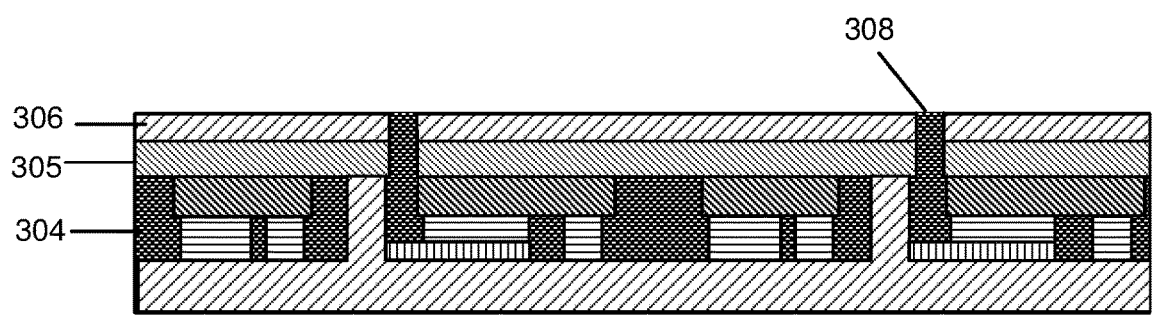
Figure 5K:
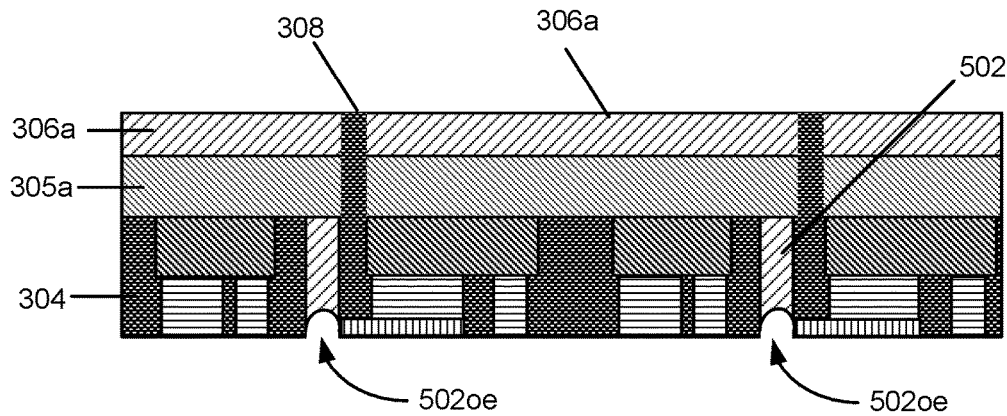

Next, as shown in FIG. 5j, in process 500, molding 308 covering the packaging structure is removed (e.g., by back grinding) to re-expose copper plate segments 306a. As shown in FIG. 5k, the temporary carrier substrate (i.e., copper substrate 501) may be removed from the packaging structure, for example, by etching (e.g., using a timed etch). The etch may remove copper substrate 501, but in some instances may result in an over etch recess (recess 502oe) in conductive pedestal 502.

Over etch recess 502oe in pedestal 502 may be back filled with conductive paste or epoxy when a source contact pad (e.g., die interconnect 150AB, FIG. 2a) is further formed in the packaging structure.

Figure 5L:
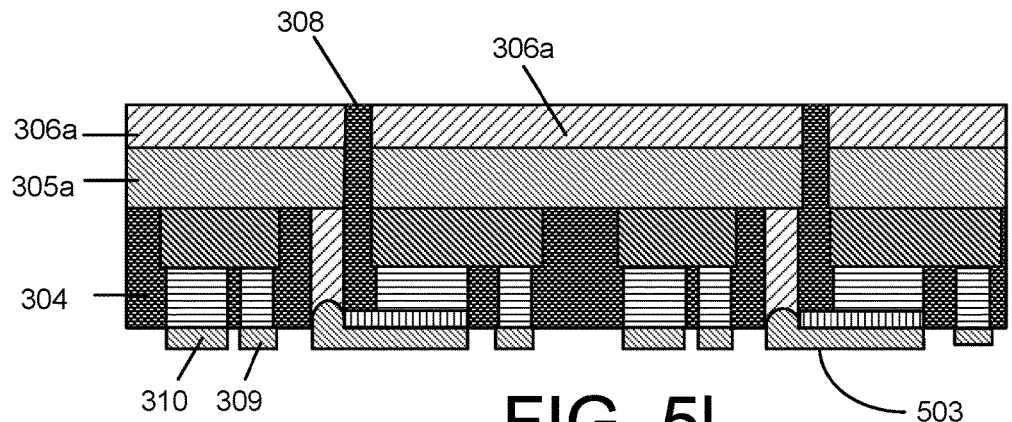

As shown in FIG. 5l, screen printing and reflow may be used to pattern gate contact pads 309 (e.g., gate contact pad 150A1 and gate contact pad 150B1, FIG. 2a) for dies 101a and 101b, a source contact pad 310 (e.g., source contact pad 150B2, FIG. 2a) for die 101b, and a source contact pad 503 (e.g., source contact pad 150AB, FIG. 2a) for die 101a, using conductive paste or epoxy (e.g., a wafer backside coating). The wafer backside coating material may extend source contact pad 503 to back fill over etch recess 502oe in pedestal 502 and thus maintain mechanical and electrical continuity of pedestal 502 with source contact pad 503.

Figure 5M:
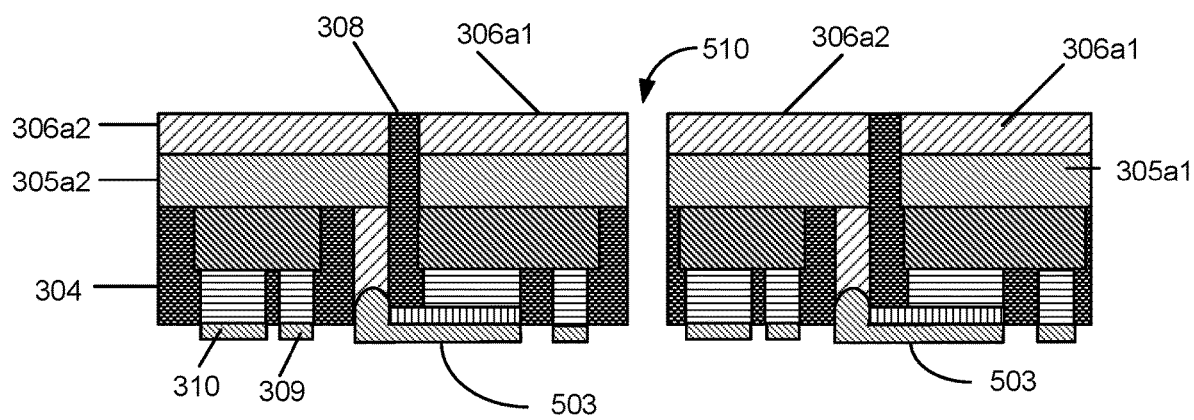

As shown in FIG. 5m, individual MCM package may be singulated by cutting the packaging structure along saw cuts 510. The singulating saw cuts 510 divide copper plate segments 306a and conductive adhesive layer segments 305a into copper plate sub-segments 306a1 and conductive adhesive layer sub-segments 305a1 to form a drain contact (e.g., a drain coupling portion 145A, an outer conductive plate 140A, FIG. 2b) over die 101a, and copper plate sub-segment 306a2 and conductive adhesive layer sub-segment 305a2 to form a drain contact (e.g., drain coupling portion 145B, outer conductive plate 140B, FIG. 2b) over die 101b.

Each individual MCM package may include a first semiconductor die (101a) and a second semiconductor die (101b) with a source of the first semiconductor die connected to a drain of the second semiconductor die via copper pedestal 502 that is supported in place by molding 304 and 308.

Figure 6A:
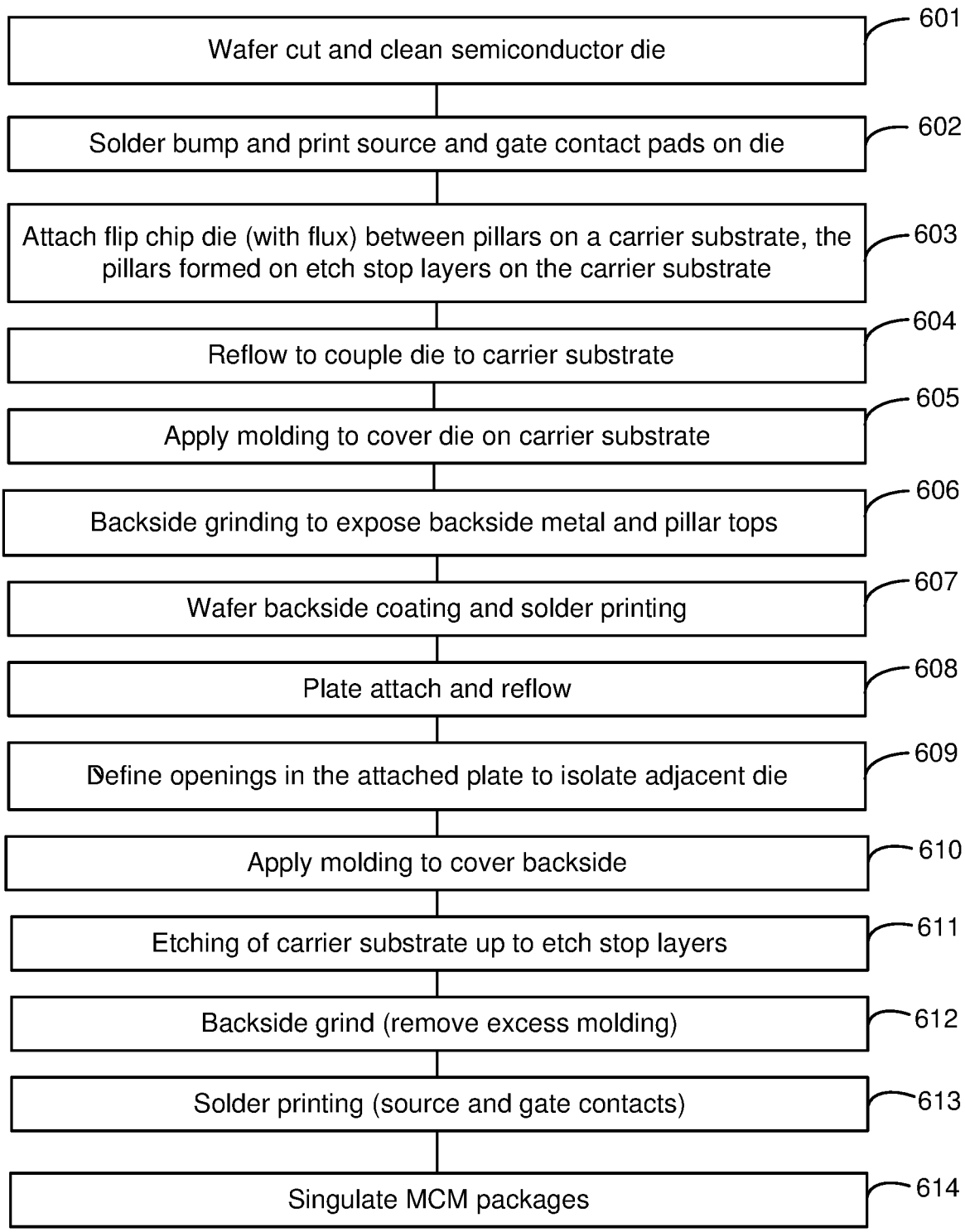
FIGS. 6a through 6c are flowcharts that illustrate methods for making MCM packages.
Figure 6B:
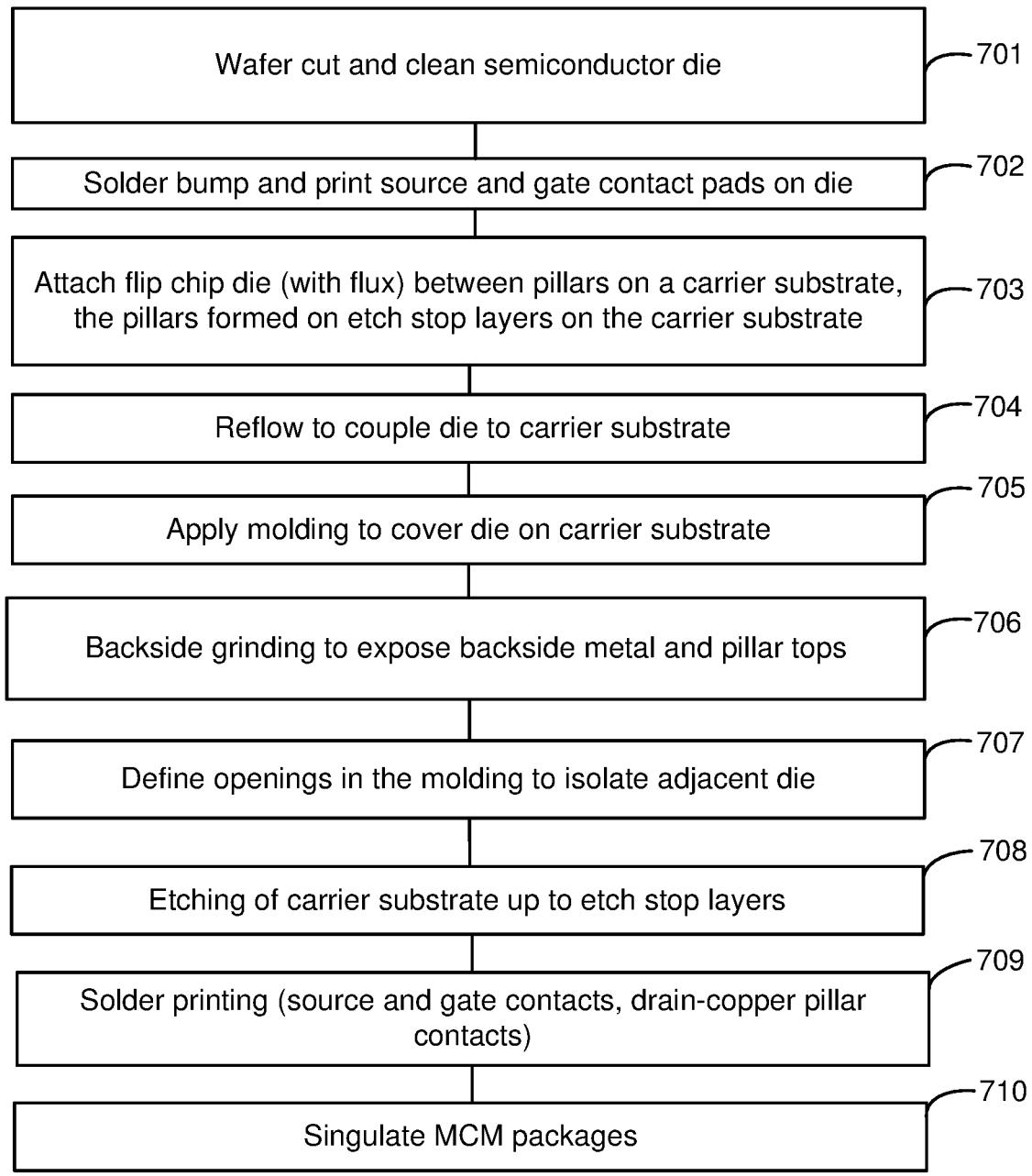
Figure 6C:
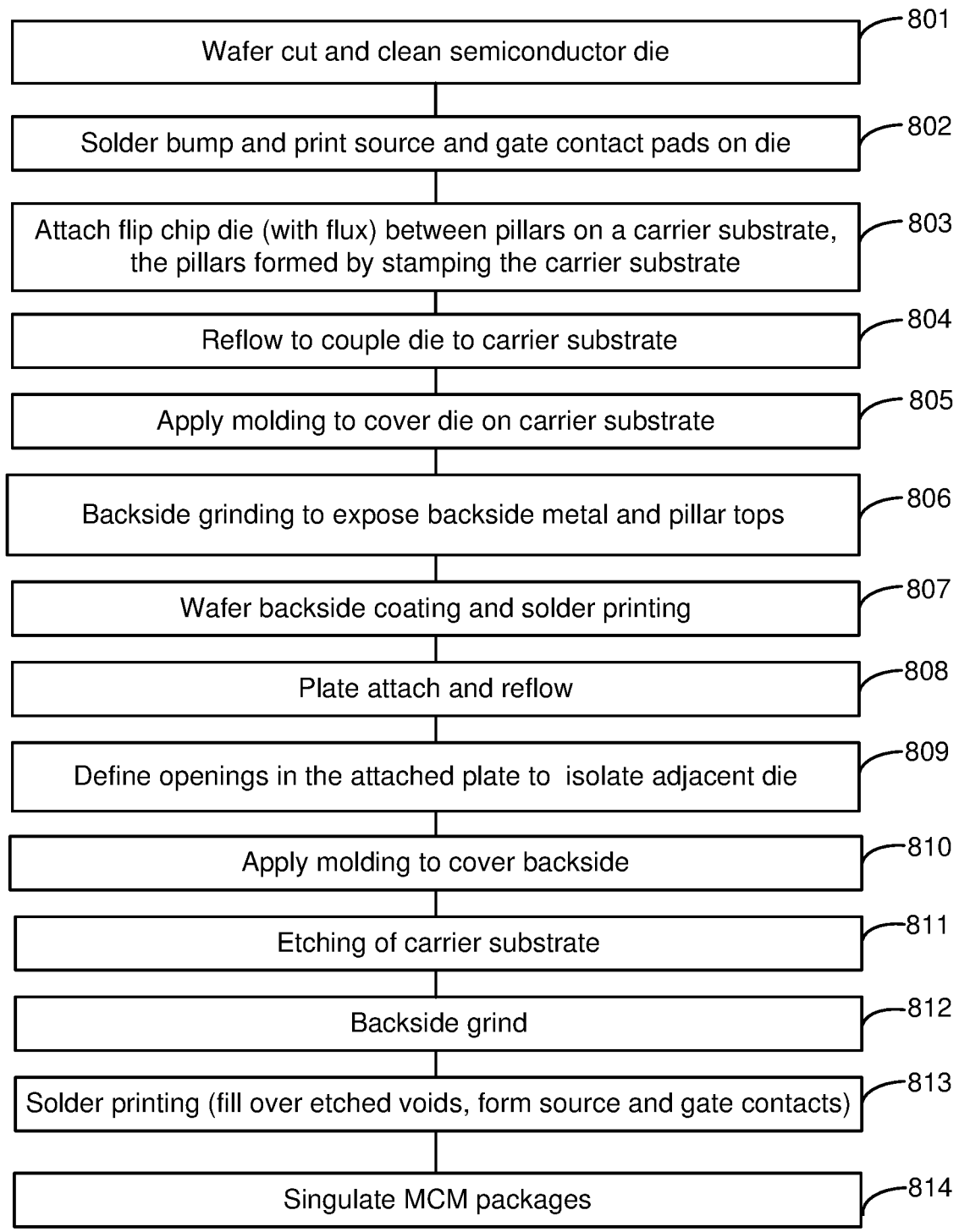

FIGS. 6a through 6c are flowcharts that illustrate methods 600a through 600c for packaging multiple semiconductor devices in an MCM package, in accordance with the principles of the present disclosure.

As shown in FIG. 6a, method 600a includes dicing a semiconductor wafer to separate die (601), and forming solder bump and printing source and gate contact pads on the die (602). Method 600a further includes placing the die (e.g., in flip chip configuration), with flux, in between pillars (e.g., copper pillars) on a temporary carrier substrate (603) and reflowing the flux to attach the die to the temporary carrier substrate (604). The pillars may be formed on etch stop layers on the temporary carrier substrate (See e.g., FIGS. 3a-3c).

Method 600a further includes applying a molding material to cover the die and the pillars on the temporary carrier substrate with the molding material (605), backside grinding to expose backside metal of the die and tops of the pillars (606), applying a wafer backside coating (WBC) and solder printing (607), and attaching a plate (e.g., copper plate) and reflow (608) (See e.g., FIGS. 3d-3g).

Method 600a further includes defining (e.g., cutting) openings or grooves in the attached plate to isolate adjacent die to be included in the MCM package (609), applying a molding material to cover the backside of the die with the molding material (610), and etching up to etch stop layers to remove the temporary carrier substrate (611) (See e.g., FIGS. 3h-3j).

Method 600a further includes backside grinding (to remove excess molding material) to expose the plate (612), solder printing source and gate contacts on the die (613), and singulating individual MCM packages (e.g., using a blade or saw) (614) (See e.g., FIGS. 3k-3m).

Each individual MCM package may, for example, include a first semiconductor die (e.g., die 101a) and a second semiconductor die (e.g., die 101b) with a source of the first semiconductor die connected to a drain of the second semiconductor die via a pillar that is supported in place by molding material.

As shown in FIG. 6b, method 600b, like method 600a, includes dicing a semiconductor wafer to separate die (701), and solder bump and printing source and gate contact pads on die (702). Method 600b further includes placing the die (e.g., in flip chip configuration), with flux, in between pillars on a temporary carrier substrate (703) and reflowing the flux to attach the die to the temporary carrier substrate (704). The pillars may be formed on etch stop layers on the temporary carrier substrate (See e.g., FIGS. 4a-4c).

Method 600b further includes molding to cover the die and the pillars on the temporary carrier substrate with molding material (705), backside grinding to expose backside metal of the die and tops of the pillars (706) (See e.g., FIGS. 4d-4e).

Method 600b, like method 600a, further includes defining openings or grooves in the molding to isolate adjacent die to be included in the MCM (707), and etching up to etch stop layers to remove the temporary carrier substrate (708) (See e.g., FIGS. 4f-4g).

Method 600b, like method 600a, further includes solder printing source and gate contacts on the die (709), and singulating individual MCM packages (e.g., using a blade or saw) (710) (See e.g., FIGS. 4h and 4i). Each individual MCM package may include a first semiconductor die (e.g., die 101a) and a second semiconductor die (e.g., die 101b) with a source of the first semiconductor die connected to a drain of the second semiconductor die via a pillar that is supported in place by molding material.

It will be noted that method 600b, unlike method 600a, does not include molding to cover the backside of the die with molding material (610) and does not include backside grinding (to remove excess molding material) to expose the copper plate (612).

Unlike method 600a and method 600b which involve use of a temporary carrier substrate that include pillar formed on etch stop layers, method 600c shown in FIG. 6c uses a temporary carrier substrate in which pillars or pedestals are formed by metal stamping. There is no etch stop layer between the pillars or pedestals and the material of the temporary carrier substrate used in method 600c.

Method 600c, like method 600a, includes dicing a semiconductor wafer to separate die (801), and solder bump and printing source and gate contact pads on die (802). Method 600c further includes placing the die (e.g., in flip chip configuration), with flux, in between pillars (e.g., pedestals) formed by a stamping process on a temporary carrier substrate (801) and reflowing the flux to attach the die to the temporary carrier substrate (804) (See e.g., FIGS. 5a-5c).

Method 600c, like method 600a, further includes molding to cover the die and the copper pedestals on the temporary carrier substrate with molding material (805), backside grinding to expose backside metal of the die and tops of the copper pedestals (806), applying a wafer backside coating (WBC) and solder printing (807), and attaching a plate and reflow (808) (See e.g., FIGS. 5*d*-5*g*).

Method 600*c*, like method 600*a*, further includes defining (e.g., cutting) openings or grooves in the attached plate to isolate adjacent die to be included in the MCM package (809), applying a molding material to cover the backside of the die with the molding material (810), and etching (e.g., timed etching) to remove the temporary carrier substrate (e.g. by a timed etch) (811). The etching may recess the pillars and leave over etch recesses in the pillars as, unlike in method 600*a*, there is no etch stop layer to prevent etchants from reaching the pillars (See e.g., FIGS. 5*h*-5*k*).

Method 600*c* may further include backside grinding to thin the plate (812), solder printing source and gate contacts on the die, and back filling over etch recesses in the copper pedestals with conductive material (813), and singulating individual MCM packages (e.g., using a blade or saw) (814).

In an example implementation, the methods and techniques described herein may be used to mold a pair of power MOSFET devices in a MCM package, the pair of devices including a low side power MOSFET and a high side power MOSFET with the source region of the low side power MOSFET in electrical contact with the drain region of the high side power MOSFET via a copper pillar or copper pedestal embedded in the mold.

It will also be understood that when an element or other MCM component, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application (if included) may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application-specific integrated circuit).

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A method comprising:
   attaching a plurality of semiconductor die to a temporary carrier substrate between copper pillars disposed on the temporary carrier substrate, each of the plurality of semiconductor die having a backside metal drain contact;
   covering the plurality of semiconductor die and the copper pillars on the temporary carrier substrate with molding material;
   backside grinding the molding material to expose first ends of the copper pillars and the backside metal drain contacts of the plurality of semiconductor die;
   applying a first layer of conductive material to electrically connect the first ends of the copper pillars and backside metal drain contacts of the plurality of semiconductor die;
   cutting grooves in the first layer of conductive material to isolate pairs of adjacent semiconductor dies of the plurality of semiconductor die to be contained in individual multi-chip module (MCM) packages, each pair of adjacent semiconductor die including a first semiconductor die and a second semiconductor die;
   removing the temporary carrier substrate to expose second ends of the copper pillars in place in the molding material;
   applying a second layer of conductive material to electrically connect the second ends of the copper pillars and source contacts of the pairs of adjacent semiconductor die; and
   singulating the individual MCM packages, each individual MCM package including the first semiconductor die and the second semiconductor die of a pair of adjacent semiconductor die with a source of the first semiconductor die connected to a drain of the second semiconductor die via one of the copper pillars left in place in the molding material.

2. The method of claim 1, wherein removing the temporary carrier substrate exposing second ends of the copper pillars in place in the molding material includes etching away the temporary carrier substrate.

3. The method of claim 2, wherein each of the copper pillars is disposed on an etch stop layer on the temporary carrier substrate, and wherein etching away the temporary carrier substrate includes etching the temporary carrier substrate up to the etch stop layer.

4. The method of claim 2, wherein each of the copper pillars is disposed directly on the temporary carrier substrate, and wherein applying the second layer of conductive material includes back filling recesses in the copper pillars caused by etching away the temporary carrier substrate.

5. The method of claim 1, wherein applying a first layer of conductive material to electrically connect the first ends of the copper pillars and the backside metal drain contacts includes attaching a copper plate to the first ends of the copper pillars and the backside metal drain contacts.

6. The method of claim 5, wherein cutting grooves in the first layer of conductive material to isolate adjacent semiconductor dies to be contained in individual MCM packages includes cutting openings in the copper plate.

7. A method comprising:
disposing a first semiconductor die between a conductive layer and a conductive connection layer portion;
disposing a second semiconductor die between the conductive layer and the conductive connection layer portion, the second semiconductor die having a first side facing the conductive connection layer portion and being co-planar with a first side of the first semiconductor die facing the conductive connection layer portion;
disposing a conductive pillar electrically coupled to the conductive layer and the conductive connection layer portion,
disposing a first molding portion between the first semiconductor die and the second semiconductor die including between the first semiconductor die and the conductive pillar;
disposing a conductive pillar electrically coupled to the conductive layer and the conductive connection layer portion,
the conductive pillar defining at least a portion of an electrical path between the first semiconductor die and the second semiconductor die,
the first side of the second semiconductor die including a source coupled to the conductive connection layer portion via a conductive source coupling layer; and
forming a molded body portion of a multi-chip module (MCM) package having a first outer surface and a second outer surface, the conductive layer defining at least a portion of the first outer surface of the molded body portion of the MCM package, the conductive connection layer portion being disposed outside of the second outer surface of the molded body portion of the MCM package, and the first molding portion extending between the first outer surface and the second outer surface of a molded body portion of the MCM package.

8. The method of claim 7, wherein the first molding portion disposed between the first semiconductor die and the conductive pillar vertically extends from the first outer surface to the conductive connection layer portion disposed outside of the second outer surface.

9. The method of claim 7, wherein the conductive connection layer portion is a first conductive connection layer portion, and wherein the conductive pillar is electrically coupled to the second semiconductor die via a second conductive connection layer portion.

10. The method of claim 7, wherein the first molding portion embeds the conductive pillar.

11. A method comprising:
disposing a conductive layer to define at least a portion of a first outer surface of a molded body portion of a multi-chip module (MCM) package;
disposing a conductive connection layer portion outside of a second outer surface the molded body portion of the MCM package;
disposing a first semiconductor die disposed between the conductive layer and the conductive connection layer portion;
disposing a second semiconductor die between the conductive layer and the conductive connection layer portion, the second semiconductor die having a first side facing the conductive connection layer portion and being co-planar with a first side of the first semiconductor die facing the conductive connection layer portion;
disposing a first molding portion between the first semiconductor die and the second semiconductor die, the first molding portion extending between the first outer surface and the second outer surface of the molded body portion of the MCM package;
disposing a conductive pillar electrically coupled to the conductive layer defining at least a portion of the first outer surface and the conductive connection layer portion disposed outside of the second outer surface,
the conductive pillar defining at least a portion of an electrical path between a drain of the first semiconductor die and a source of the second semiconductor die, and the conductive connection layer portion defining at least a portion of the electrical path between the drain of the first semiconductor die and the source of the second semiconductor die; and
disposing a conductive spacer electrically coupled between the conductive pillar and the conductive connection layer portion.

12. The method of claim 11, further comprising:
using the conductive spacer as an etch stop.

13. A method comprising:
disposing a copper pillar disposed between a first semiconductor die and a second semiconductor die, each of the first and second semiconductor dies having a backside metal drain contact,
the copper pillar and the first semiconductor die and the second semiconductor die being covered with molding material with a first end of the copper pillar, a second end of the copper pillar, and the backside metal drain contact of the each of first and second semiconductor dies exposed through the molding material;
disposing a first layer of conductive material electrically connecting the first end of the copper pillar and the backside metal drain contact of the first semiconductor die; and
disposing a second layer of conductive material electrically connecting the second end of the copper pillar and a source contact of the second semiconductor die.

14. The method of claim 13, wherein the second layer of conductive material back fills over etch recesses in the copper pillar.

15. The method of claim 13, further comprising:
disposing a copper plate attached to the first end of the copper pillar and the backside metal drain contact of the first semiconductor die.

16. The method of claim 13, wherein the copper pillar, the first layer of conductive material, and the second layer of conductive material define at least a portion of an electrical path between a drain of a first semiconductor die and a source of a second semiconductor die.

17. The method of claim 13, wherein the first semiconductor die and the second semiconductor die each have a drain facing a first outer surface of a multi-chip module (MCM) package, and the first semiconductor die and the second semiconductor die each have a source facing a second outer surface of the MCM package.

18. The method of claim 13 further comprising disposing a molding portion between the first layer of conductive material and the second layer conductive material.

* * * * *